US006267545B1

(12) United States Patent
Mooring et al.

(10) Patent No.: US 6,267,545 B1
(45) Date of Patent: Jul. 31, 2001

(54) SEMICONDUCTOR PROCESSING PLATFORM ARCHITECTURE HAVING PROCESSING MODULE ISOLATION CAPABILITIES

(75) Inventors: Benjamin W. Mooring, Austin, TX (US); Nicolas J. Bright, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/340,981

(22) Filed: Jun. 28, 1999

Related U.S. Application Data

(63) Continuation-in-part of application No. 09/280,177, filed on Mar. 29, 1999, now Pat. No. 6,095,741.

(51) Int. Cl.$^7$ .................................................. B65G 49/07
(52) U.S. Cl. ........................ 414/217; 414/939; 414/805
(58) Field of Search ................................ 414/217, 939, 414/805

(56) References Cited

U.S. PATENT DOCUMENTS

| 3,789,875 | 2/1974 | McGee ................................. 137/553 |
| 4,340,462 | 7/1982 | Koch .................................... 204/298 |
| 4,355,937 | 10/1982 | Mack et al. ........................... 414/217 |
| 4,483,654 | 11/1984 | Koch et al. ........................... 414/744 |
| 4,593,915 | 6/1986 | Seger et al. ........................... 277/12 |
| 4,715,764 | 12/1987 | Hutchinson .......................... 414/217 |
| 4,715,921 | 12/1987 | Maher et al. ......................... 156/345 |
| 4,721,282 | 1/1988 | Shawver et al. ....................... 251/62 |
| 4,747,577 | 5/1988 | Dimock ................................ 251/158 |
| 4,753,417 | 6/1988 | Madocks et al. ..................... 251/158 |
| 4,795,299 | 1/1989 | Boys et al. ............................ 414/217 |
| 4,804,086 | 2/1989 | Grohrock ............................. 206/328 |
| 4,813,846 | 3/1989 | Helms ................................ 414/744.1 |
| 4,917,556 | 4/1990 | Stark et al. ........................... 414/217 |
| 5,002,255 | 3/1991 | Sawa et al. ........................... 251/193 |
| 5,076,205 | 12/1991 | Vowles et al. ........................ 118/719 |
| 5,100,276 | 3/1992 | Iwasaki et al. ....................... 414/222 |
| 5,120,019 | 6/1992 | Davis, Jr. ............................. 251/193 |
| 5,150,882 | 9/1992 | Kaneko ................................ 251/193 |

(List continued on next page.)

FOREIGN PATENT DOCUMENTS

| 03020188 | 1/1991 | (EP) | ............................... F16K/49/00 |
| WO 92/02950 | 2/1992 | (EP) | ............................... H01L/21/00 |
| 591085A1 | 6/1994 | (EP) | ............................... H01L/21/00 |
| 3-20188 | 3/1991 | (JP) | ............................. H01L/21/203 |
| 1093854 | 5/1984 | (RU) | ............................... F16K/3/18 |
| WO 99/03133 | 1/1999 | (WO) | ............................. H01L/21/00 |
| WO 00/02228 | 1/2000 | (WO) | ............................. H01J/37/18 |

*Primary Examiner*—Steven A. Bratlie
(74) *Attorney, Agent, or Firm*—Martine Penilla & Kim, LLP

(57) ABSTRACT

An interlocked control system is provided for dual sided slot valves contained in a vacuum body between each of a plurality of adjacent process and transport modules. Separate valves are provided for each of two valve body slots, one body slot being separately closed or opened independently of the other. The separate valves allow a vacuum in the transport module while an adjacent process module is open to the atmosphere for servicing. Under control of the system, the valve may allow separate operation of the transport module and certain ones of the process modules, while a selected one of the process modules is in either a maintenance state or a locked out state for servicing. The system includes a separate controller for the transport module and a separate controllers for the process modules. A control interface coordinates the flow of signals between the controllers and local devices, and system user interfaces provide inputs to the control system from operational and service personnel.

21 Claims, 26 Drawing Sheets

U.S. PATENT DOCUMENTS

| | | | |
|---|---|---|---|
| 5,292,393 | 3/1994 | Maydan et al. | 156/345 |
| 5,383,338 | 1/1995 | Bowsky et al. | 62/125 |
| 5,455,082 * | 10/1995 | Saito et al. | 427/452 |
| 5,562,800 | 10/1996 | Kawamura et al. | 156/643.1 |
| 5,663,884 * | 9/1997 | Nishihata et al. | 364/468.28 |
| 5,667,197 | 9/1997 | Boyd et al. | 251/193 |
| 5,697,749 | 12/1997 | Iwabuchi et al. | 414/217 |
| 5,697,759 | 12/1997 | Bacchi et al. | 414/786 |
| 5,769,952 | 6/1998 | Komino | 118/733 |
| 5,789,318 | 8/1998 | Delfino et al. | 438/656 |
| 5,902,088 | 5/1999 | Fairbairn et al. | 414/217 |
| 5,980,684 | 11/1999 | Hori et al. | 156/345 |
| 6,095,741 | 8/2000 | Kroeker et al. | 414/217 |

\* cited by examiner

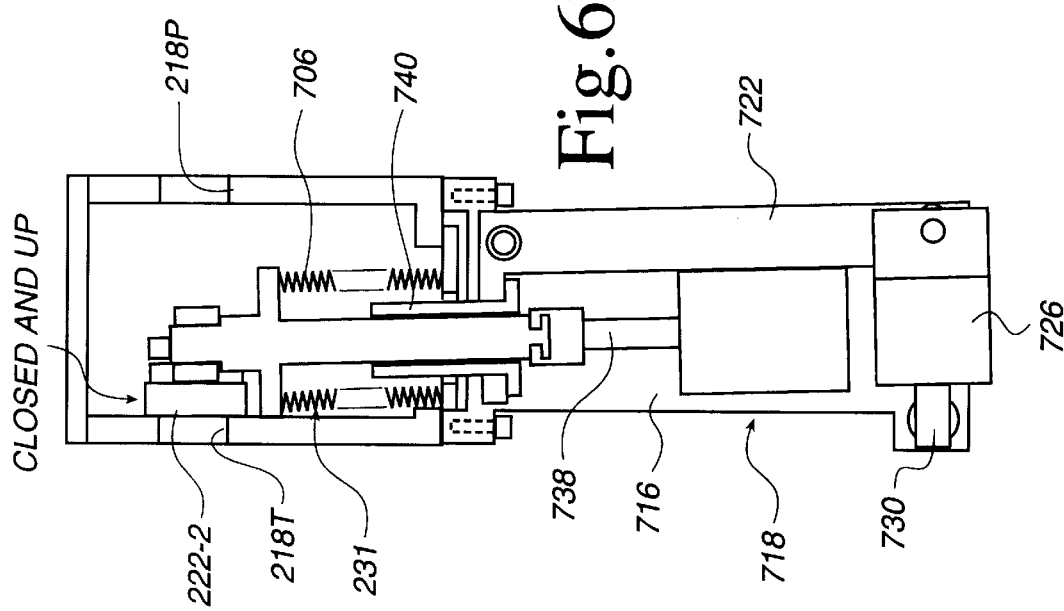
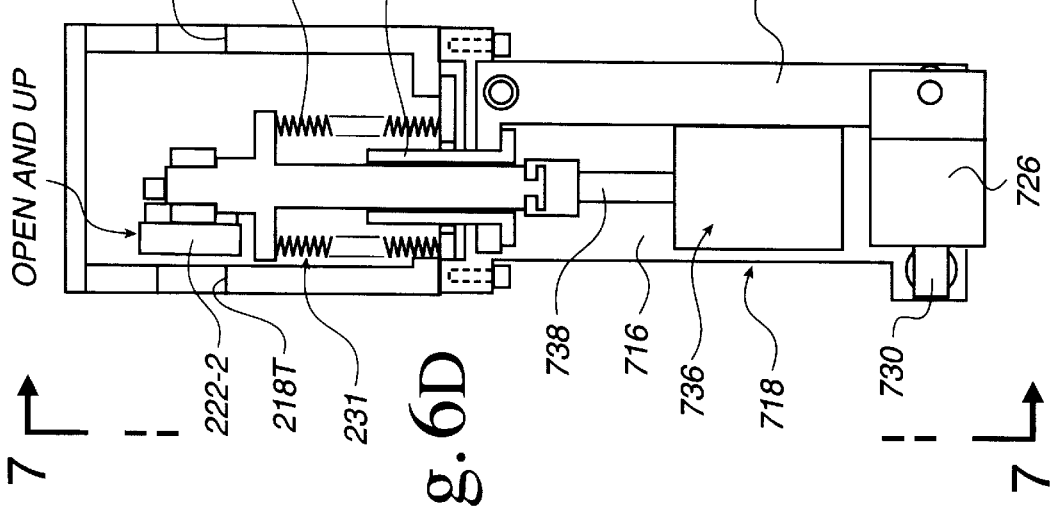
Fig. 6E
Fig. 6D

SEMICONDUCTOR PROCESSING PLATFORM ARCHITECTURE HAVING PROCESSING MODULE ISOLATION CAPABILITIES

CROSS REFERENCE TO RELATED APPLICATIONS

This application is a continuation-in-part of U.S. patent application having application Ser. No. 09/280,177, now U.S. Pat. No. 6,095,741, filed Mar. 29, 1999, and entitled "Dual-Sided Slot Valve and Method For Implementing The Same," and having inventors Tony R. Kroeker, Benjamin W. Mooring, and Nicholas J. Bright. This application is hereby incorporated by reference.

BACKGROUND OF THE INVENTION

1. Field of the Invention

The present invention relates generally to controlling valves for modules of semiconductor processing equipment, and more particularly to controlling the operation of dual sided slot valves and methods of implementing operations of such valves between separate chambers of semiconductor processing equipment so that processing operations may continue in one chamber during servicing of the other chamber.

2. Description of the Related Art

In the manufacture of semiconductor devices, process chambers are interfaced to permit transfer of wafers, for example, between the interfaced chambers. Such transfer is via transport modules that move the wafers, for example, through slots or ports that are provided in the adjacent walls of the interfaced chambers. For example, transport modules are generally used in conjunction with a variety of substrate processing modules, which may include semiconductor etching systems, material deposition systems, and flat panel display etching systems. Due to the growing demands for cleanliness and high processing precision, there has been a growing need to reduce the amount of human interaction during and between processing steps. This need has been partially met with the implementation of transport modules which operate as an intermediate handling apparatus (typically maintained at a reduced pressure, e.g., vacuum conditions). By way of example, a transport module may be physically located between one or more clean room storage facilities where substrates are stored, and multiple substrate processing modules where the substrates are actually processed, e.g., etched or have deposition performed thereon. In this manner, when a substrate is required for processing, a robot arm located within the transport module may be employed to retrieve a selected substrate from storage and place it into one of the multiple process modules.

As is well known to those skilled in the art, the arrangement of transport modules to "transport" substrates among multiple storage facilities and process modules is frequently referred to as a "cluster tool architecture" system. FIG. 1 depicts a typical semiconductor process cluster architecture 100 illustrating the various chambers that interface with a transport module 106. Transport module 106 is shown coupled to three process modules 108a–108c which may be individually optimized to perform various fabrication processes. By way of example, process modules 108a–108c may be implemented to perform transformer coupled plasma (TCP) substrate etching, layer depositions, and/or sputtering.

Connected to transport module 106 is a load lock 104 that may be implemented to introduce substrates into transport module 106. Load lock 104 may be coupled to a clean room 102 where substrates are stored. In addition to being a retrieving and serving mechanism, load lock 104 also serves as a pressure-varying interface between transport module 106 and clean room 102. Therefore, transport module 106 may be kept at a constant pressure (e.g., vacuum), while clean room 102 is kept at atmospheric pressure. To prevent leaks between modules during pressure varying transitions, or to seal off a process module from transport module 106 during processing, various types of gate drive valves are used to isolate the various modules.

For more information on gate drive valves, reference may be made to U.S. Pat. No. 4,721,282, which is hereby incorporated by reference. Another such gate drive valve is shown in U.S. Pat. No. 5,667,197, in which a prior art valve housing is shown having two port openings, and only one valve for one of the two port openings. Thus, it is not possible to close each of the two ports at the same time, nor to close only the port that does not have an associated valve. Also, the gate plate valve of the '282 Patent is shown for closing a port between abutting transport and process chambers, and no intermediate valve housing is provided. A drive assembly for the gate plate moves the gate plate in one continuous motion in a vertical path and in a rotating arc toward the internal port to effect a seal or closure of the internal port.

Additionally, operation of a drive assembly for the gate drive valve is monitored by a series of sensors that provide signals to a monitoring computer. However, the primary function of the computer is to analyze the movements of the drive assembly relative to the movements of a robot arm. Thus, the computer does not control the drive assembly to coordinate operation of the gate valve relative to multiple states of operation of process modules, for example.

U.S. Pat. No. 5,150,882 shows one valve between various chambers of a treatment system, including between a decompression chamber and an etching chamber. Such one valve is driven for engagement and disengagement with a gate aperture by one air cylinder and a toggle arrangement such that stopper plates hit rollers with considerable impact. Initial vertical movement of a fitting plate is changed to horizontal movement by the link that is rotated counterclockwise, such that the gate moves toward the gate aperture. For the '882 Patent to avoid problems of the prior art, the stopper plates are made from a double boride hard alloy. Further, the single motion of the one air cylinder is not stopped, but instead continues its driving operation after the abutment of the stopper plates with the rollers. Thus, in addition to requiring special materials, the '882 Patent does not provide two valves between adjacent processing chambers. Additionally, the '882 Patent does not describe a system for coordinating operation of the one air cylinder with respect to multiple states of operation of process modules. U.S. Pat. No. 4,753,417 shows a gate valve having a pair of wheels and a linear actuator for operating the valve. To facilitate process control the gate valve is fitted with sensors such as micro switches that sense gate valve positions. However, the '417 Patent also does not describe a system for coordinating operation of the linear actuator with respect to multiple states of operation of process modules.

In view of the forgoing, what is needed is a valve assembly between adjacent processing or transport chambers, and a control system for operating the valve assembly to assure that operations in one such chamber may continue while the other chamber is in one of multiple states of operation.

SUMMARY OF THE INVENTION

Broadly speaking, the present invention fills these needs by providing a dual sided slot valve in a housing between adjacent chambers of a cluster tool architecture system, and a system for controlling operation of the dual sided slot valve relative to various states of operation of process chambers, for example, of the cluster tool architecture system. Separate valves are provided for each of two valve housing ports or slots, such that a housing port and a mating port of the process chambers or transport chambers, for example, may be separately closed or opened independently of the other cooperating housing port and process chamber port. The separate valves facilitate maintaining a vacuum, for example, in a transport chamber while an adjacent process chamber is opened to the atmosphere to allow servicing to be performed. As a result, substantial periods of downtime are avoided in that no pump down cycle is needed to bring the transport chamber to a desired vacuum after servicing the process chamber, and no other operations need be performed on the transport chamber due to the servicing of the process chamber.

Also, with the transport chamber at vacuum, and with the port to the process chamber closed by a valve door next to the transport chamber, corrosive gases and plasma in the process chamber do not contaminate the transport chamber and the valve door next to the transport chamber is not subject to etching in response to materials in the process chamber. Thus, in general, only the valve door next to the process chamber need be replaced during servicing after it becomes corroded, and the transport chamber may remain at vacuum during such replacement. Finally, the other valve door between the valve and the process chamber reduces the corrosion of the bellows and other parts of the valve.

Further, the dual sided slot valve is provided with these advantages while initially allowing easy access to an open valve for performing service on the valve. Such easy access is provided by one drive which stops the valve in an open, but not laterally-spaced (i.e., not vertically-spaced), position relative to the port. In this open position the valve may be reached by a gloved hand of a worker for service. A separate drive then functions to move the valve laterally away from the open position and away from the port to expose the sealing surface around the port, which permits cleaning of the sealing surface, for example. Due to the vertical distance between the laterally-moved valve and an access opening which is normally closed by a lid, it is generally difficult for the protective glove of the worker to reach the valve for service after the vertical movement. In the vertically-moved position, however, the valve does not interfere with the ability to clean around the valve door, including the surface against which the door seals. Additionally, the actuator shafts for each of the slot valve doors may be positioned relative to each other in an offset manner so as to reduce the clean room real estate occupied by the valve housing between the adjacent transport and process chambers, for example.

It may be understood, then, that while normal operations continue in one chamber of two adjacent chambers, the control system operates to allow many types of servicing to be performed in the other of the two chambers. Such servicing may, for example, involve a maintenance state, or a locked out state, of a process module. In the maintenance state, problem diagnosis, cleaning, and testing may be performed, whereas in the locked out state one may remove broken pieces of wafers from the process chamber or the valve housing, or clean the sealing surface of a port, or clean the interior of the process chamber, or remove and replace a member of a valve (e.g., a door or an O-ring) that effects the seal with the sealing surface. These and other operations for servicing such process chambers for semiconductor processing, for example, are referred to herein as "servicing," or "service," and include operations to prepare the various chambers and modules for each of the maintenance and locked out states. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

FIG. 6D is a schematic view of the one dual sided slot valve of the present invention showing the actuator including an open/close air cylinder which rotates a cradle on a pivot plate to move the door into the OPEN or the CLOSED position, wherein the actuator also includes an up/down air cylinder which moves the door relative to the cradle in the OPEN position to align the door with the slot or move the door below the slot.

FIG. 6E is a schematic view similar to FIG. 6D showing the up/down air cylinder having moved the door relative to the cradle in the OPEN position to align the door with the slot, and the open/close air cylinder then having rotated the cradle on the pivot plate to move the door into the CLOSED position to seal the slot closed.

DETAILED DESCRIPTION OF THE PREFERRED EMBODIMENTS

An invention is described for assuring that operations may continue in one module of a semiconductor process cluster architecture during servicing of another module. The invention is described in terms of controlling valves for modules of semiconductor processing equipment, and more particularly to dual sided slot valves and methods of implementing control of such valves in separate modules of semiconductor processing equipment. It will be obvious, however, to one skilled in the art, that the present invention may be practiced without some or all of these specific details. In other instances, well known process operations have not been described in detail in order not to obscure the present invention.

A. Dual Sided Slot Valve and Operation

Figure 1:
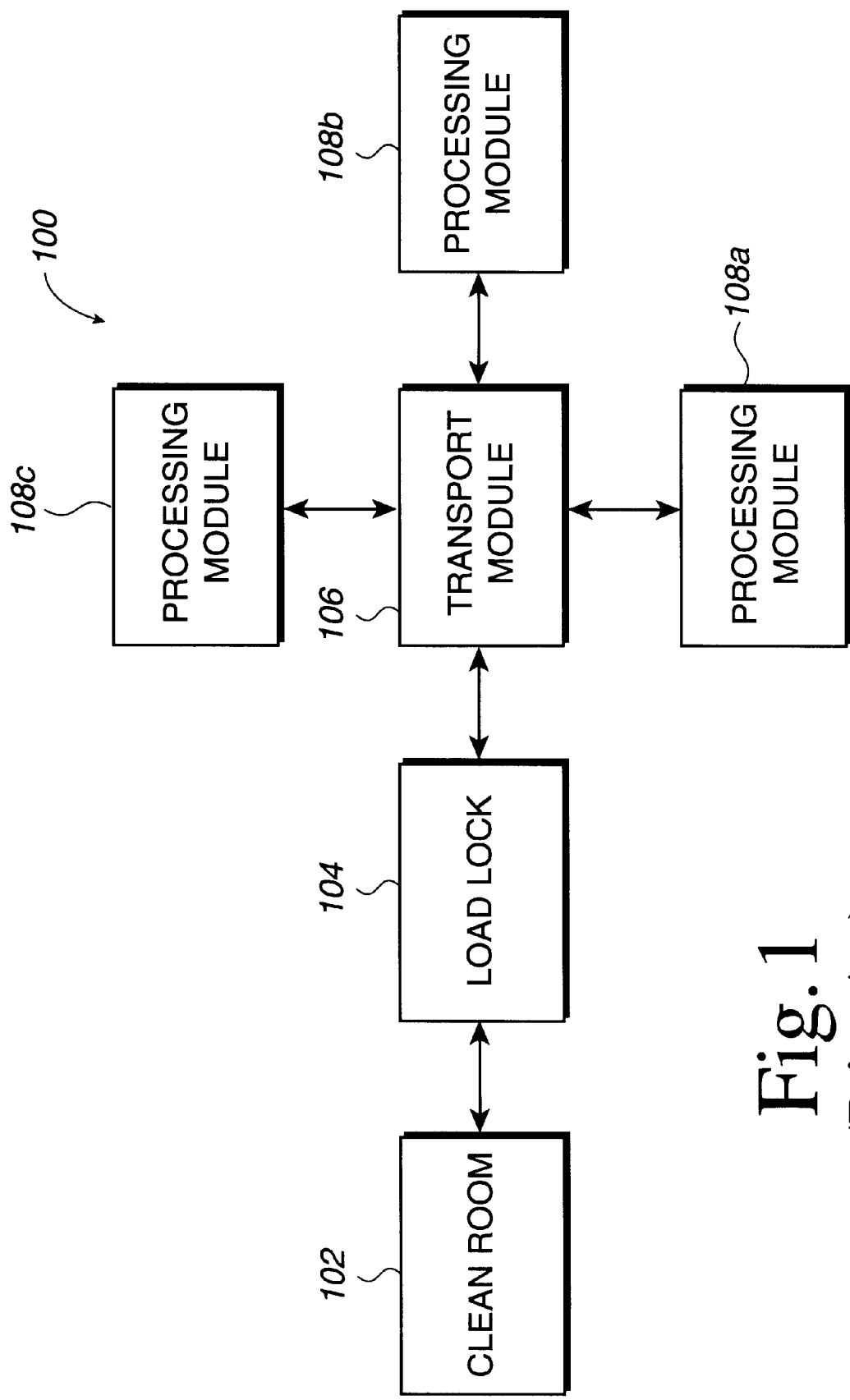
FIG. 1 depicts a typical prior art semiconductor process cluster architecture illustrating various chambers that interface with a transport module, wherein a single door valve is in one chamber or the module such that the chamber and module each must be shut down to enable servicing of either of the them.
Figure 2:
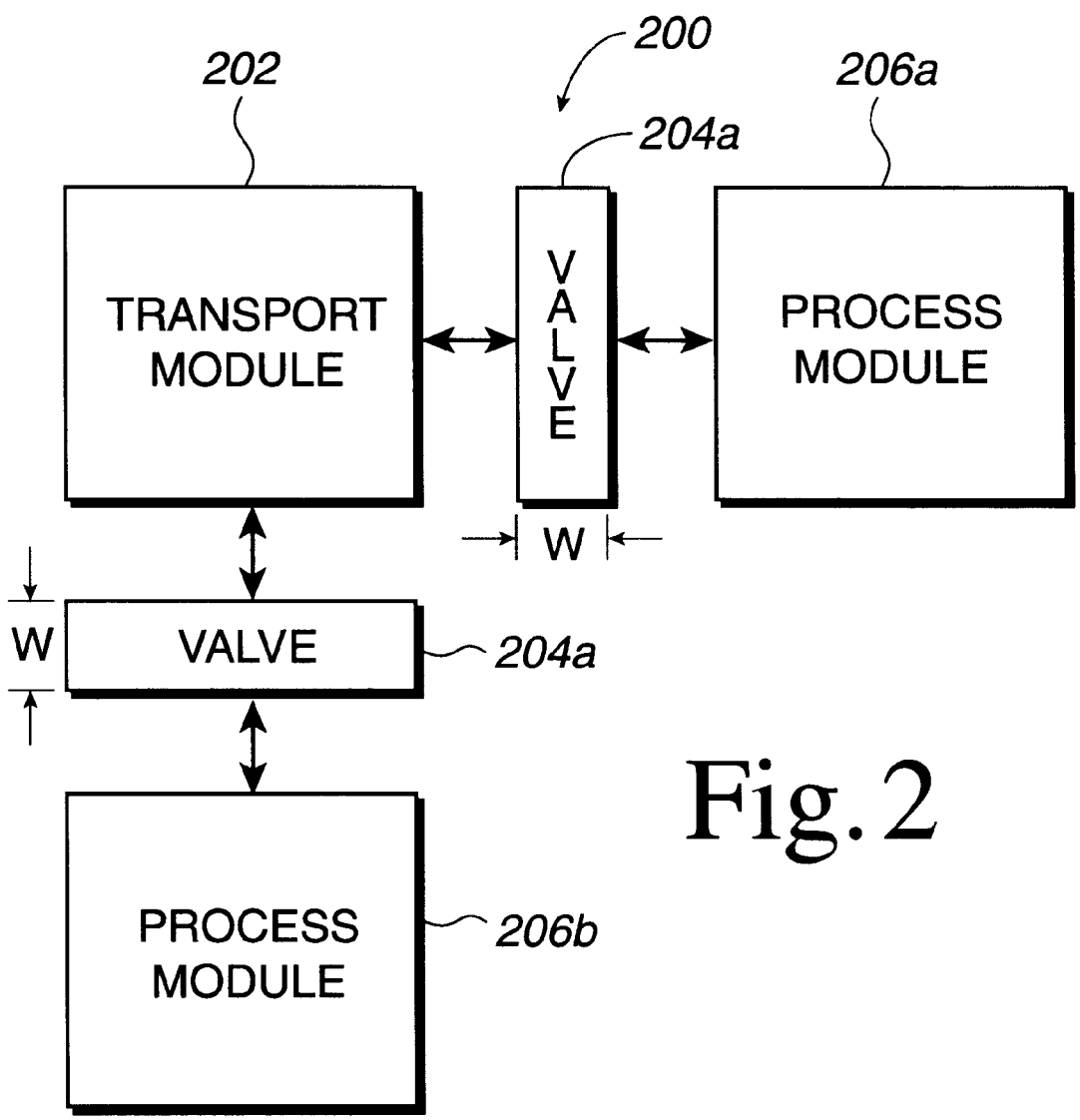
FIG. 2 depicts a dual sided slot valve of the present invention located between adjacent ones of the transport module and a process module, wherein two door valves are in a valve vacuum body of a valve housing between the transport and process modules, such that only a selected one of the modules need be shut down to enable servicing of the selected one of them.

Referring to FIG. 2, the invention is generally described as including a semiconductor process cluster architecture 200 having a transport module 202 and a process module 206a, wherein a dual sided slot valve 204a is located between adjacent ones of the transport module 202 and the process module 206a. Considering FIG. 2 as a plan view, a footprint of the architecture is defined by the combined floor area of the transport module 202, the process modules 206a and 206b, and the dual sided slot valves 204a. It may be understood that the floor areas of the transport module 202 and the process module 206a may be primarily dictated by considerations other than the manner in which the modules 202, 202b and 206a are sealed together for operations. The individual dual sided slot valves 204a define the manner in which the modules 202 and 206 are sealed together for operations, such that the footprint of each individual dual sided slot valve 204a becomes significant in attempts to reduce the footprint of the cluster architecture 200. Thus, to reduce the footprint of each individual dual sided slot valve 204a it is important to reduce the width W of each of the individual dual sided slot valve 204a as much as possible.

Figure 3:
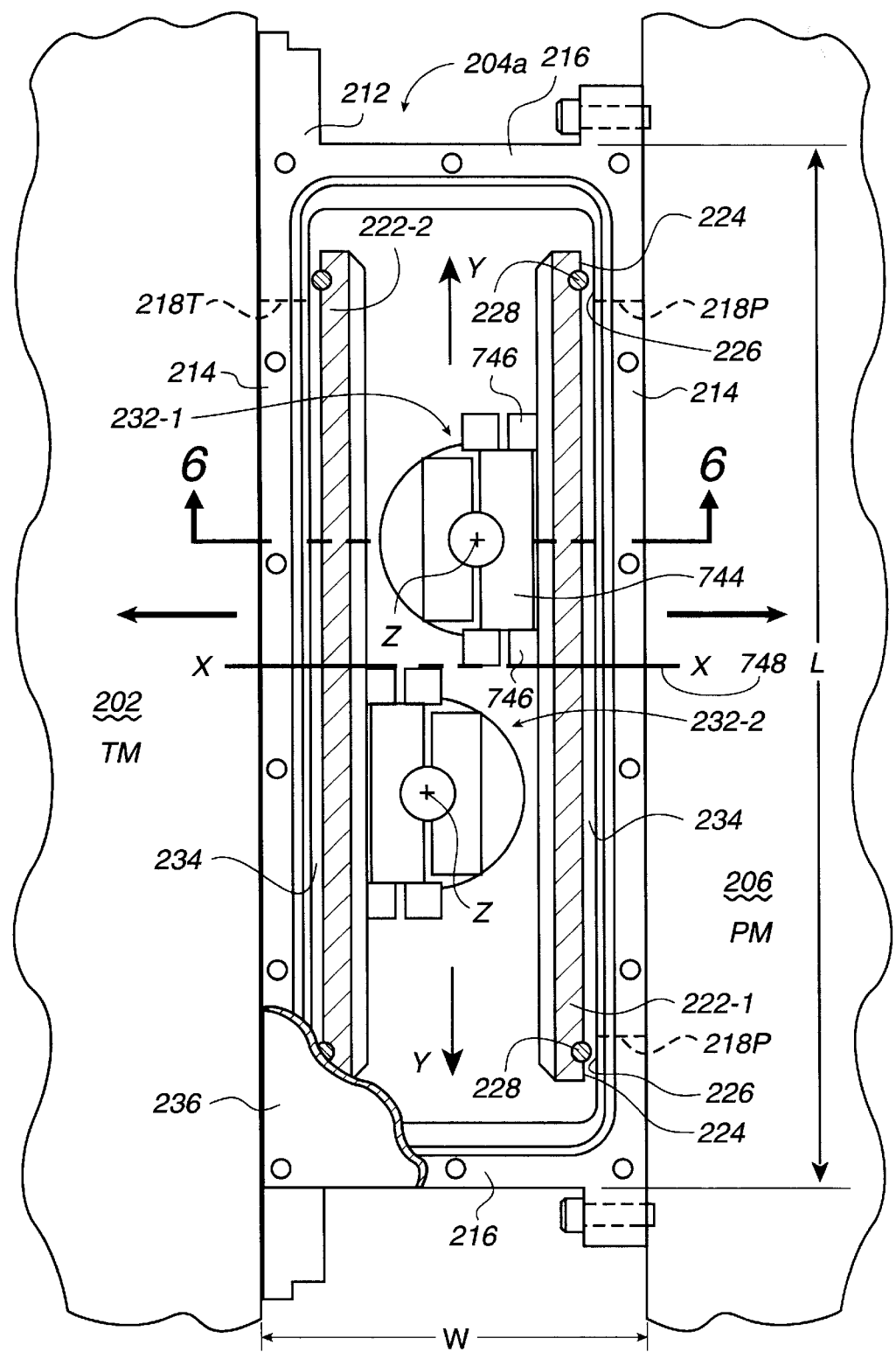
FIG. 3 is a plan view of a dual sided slot valve of the present invention showing the valve vacuum body having a width defined by opposite walls, and a slot in each wall to permit wafers to be transferred from a transport module to a process module, wherein each slot may be selectively closed by one of the two doors upon operation of one of two separate actuators to permit continued operations within the transport module while the process module is being serviced.

FIG. 3 shows one of the dual sided slot valves 204a of the invention as including a valve vacuum body 212 located between two modules of the cluster tool architecture. As shown, the two modules are the transport module 202 and one of the process modules 206, it being understood that valve vacuum body 212 may be located between any two modules of the cluster architecture. The valve vacuum body 212 has the width W defined by opposite walls 214. The side of the wall 214 nearest to the process module 206 may be referred to as the "PM side," whereas the side of the wall 214 nearest to the transport module 202 may be referred to as the "TM side." The valve vacuum body 212 has a length L defined by opposite end walls 216, where the width W times the length L defines the footprint of the individual dual sided slot valve 204a.

A port (or slot or opening) 218 is provided in each wall 214 to permit wafers (not shown), for example, to be transferred between one module and another module. As shown in FIG. 3, one such module is the transport module 202 and the other such module is the process module 206, with the slot 218P being adjacent to the process module 206 and the slot 218T being adjacent to the transport module 202. Each of the slots 218 is generally rectangular in shape and is smaller in each dimension than the generally rectangular shape of a door (or side door) 222 provided for closing the respective slot 218. In the case of the doors 222 and the slots 218, the corners are rounded, thus the respective rectangular shapes are referred to as "generally rectangular." Each of the doors 222 has a seal periphery 224 that overlaps an opposing seal surface 226 of the opposing wall 214 of the body 212. The seal periphery 224 may be provided with a seal device such as an O-ring 228 which is pressed against the seal surface 226 to provide an air-tight seal when the door 222 is in a CLOSED position as described below. Alternatively, a seal device may be vulcanized to the door 222, or another type of seal device having a replaceable seal may be used. The door 222-2 at the wall 214 forms a pressure seal between the transport module 202 and the process module 206. In this manner, the PM side may be vented to atmosphere while the TM side remains at vacuum. During normal operation of the modules 202 and 206 with both of the doors 222 closed, the combined seal periphery 224, opposing seal surface 226, and O-ring 228 allow the transport module 202 to run, or operate, at normal vacuum level (e.g., 80–100 mTorr) while the process module 206, for example, runs at process pressure. The valve 204a is also designed to allow the transport module 202 to be vented while the process module 206 is at vacuum, or to allow the process module 206 to be vented while the transport module 206 is at vacuum.

Referring to one of the doors 222, described as the door 222-1 and shown for example at the right as viewed in FIG. 3, the respective slot 218P may be selectively closed upon operation of one of two actuators 232. One of the actuators 232 corresponds to the door 222-1, is referred to as the actuator 232-1, and may be operated separately from the other actuator 232 that corresponds to the door 222-2 and that is referred to as the actuator 232-2. Such separate actuation permits, for example, continued operations within the transport module 202 while the process module 206a, for example, is being serviced. Therefore, only a selected one of the transport module 202 and the process module 206a need be shut down to enable servicing of the selected one of them. One result of actuation of the actuator 232 is to locate the door 222 in a CLOSED position, or in an OPEN position as shown in FIG. 3. In the OPEN position, the door 222 defines a space 234 between the door 222 and the wall 214. Another type of actuation of the actuator 232 is to locate the door 222 in either a DOWN or an UP position, which positions are along the Z-axis shown in FIG. 3.

Figure 4A:
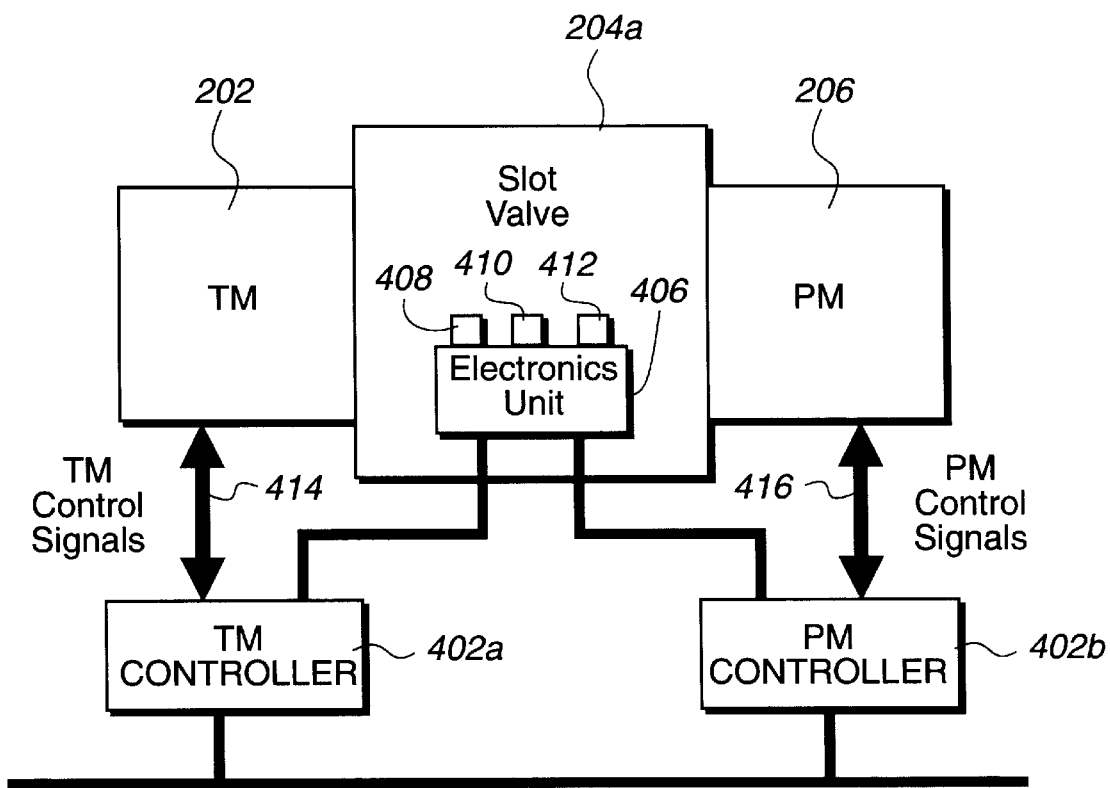
FIG. 4A is a schematic diagram of controllers for controlling the movements of a respective first door and a respective second door of the valve, wherein the controllers are coupled to a computer workstation that is used to operate the dual slot valve.
Figure 4B:
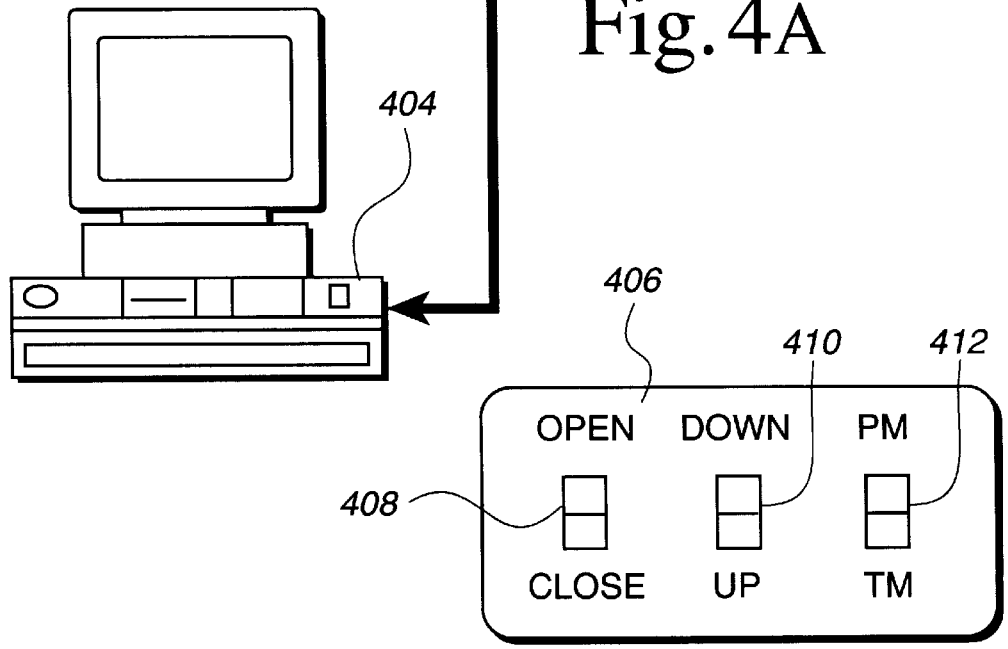
FIG. 4B depicts three switches for providing input to the controllers to facilitate controlling the movements of the first door and the second door of the valve.

FIG. 4A shows the transport module 202, the process module 206, and one of the dual sided slot valves 204a. A controller 402a is connected to, and controls, the operation of the transport module 202. The controller 402a is also connected to the TM side of the valve 204a for controlling the door 222-2. A controller 402b is connected to, and controls, the operation of the process module 206. The controller 402b is also connected to the PM side of the valve 204a for controlling the door 222-1. The controllers 402a and 402b are connected to a computer workstation, or tool controller, 404. The controllers 402a and 402b interface with the respective TM side and the PM side of the valve 204a via an electronics unit 406. FIG. 4B shows the top of the electronics unit 406 provided with a series of switches 408, 410, and 412, which are respectively for controlling the movement of the doors 222 into the OPEN and CLOSED positions, for controlling the movement of the doors 222 into the DOWN and UP positions, and for selecting which of the modules 202 and 206 is to be serviced (e.g., process module 206 is "PM"; and transport module 202 is "TM"). Examples of the signals 414 and 416 transmitted between respective ones of the controller 402a and 402b and the slot valve 204a are "Open Door," "Close Door," and "Door Enable."

Figure 5A:
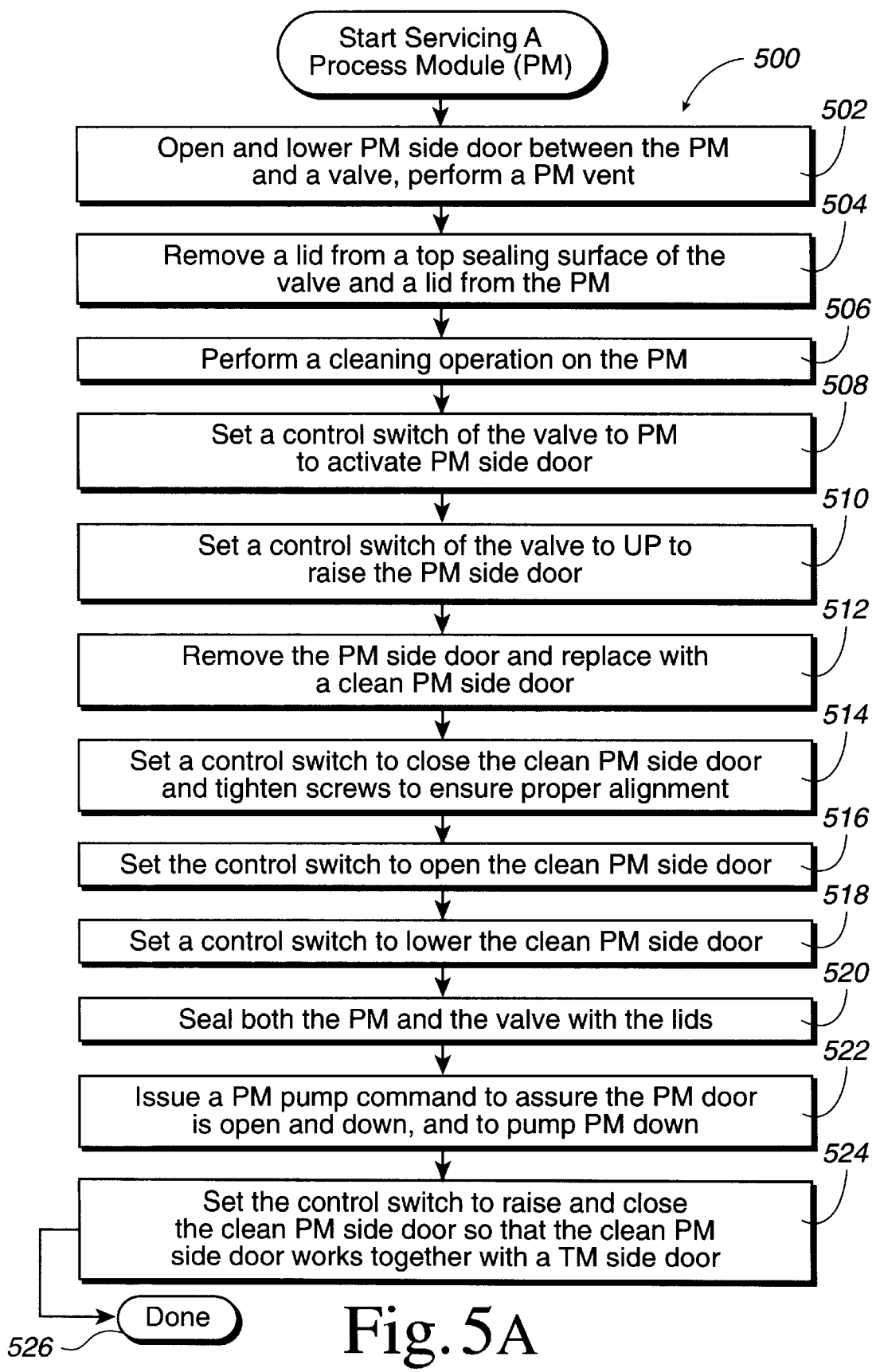
FIG. 5A depicts a flow chart illustrating the operations in a method of servicing a process module that operates in conjunction with the transport module, including controlling the movements of the first door and the second door of the valve to permit continued operations within the transport module while the process module is being serviced.
Figure 6A:
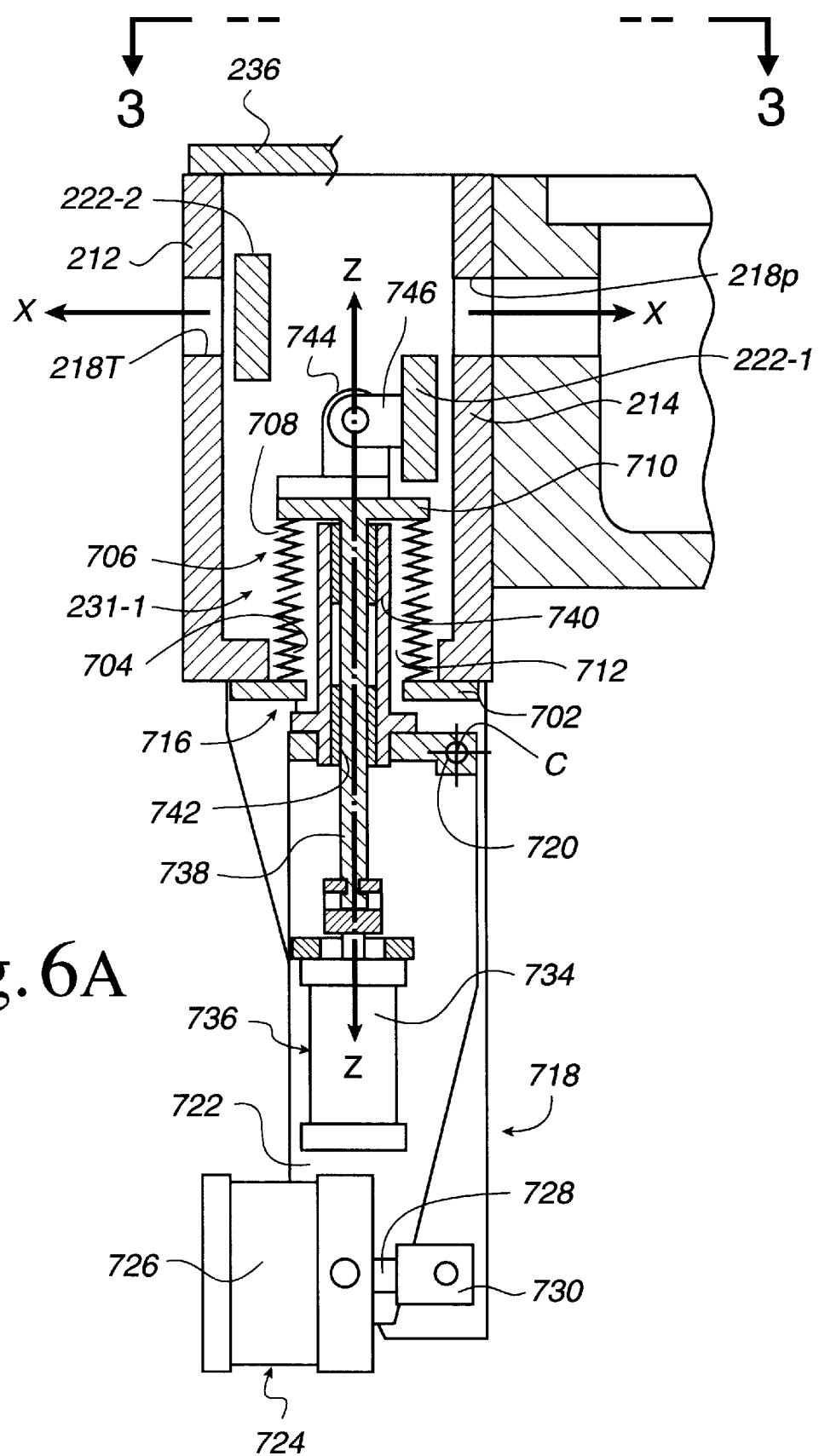
FIG. 6A is a vertical cross-sectional view taken along line 6—6 in FIG. 3 showing one of the two dual sided slot valves of the present invention in an OPEN and DOWN position, and showing one of the two actuators for closing one of the two doors, wherein the one actuator has two separately controllable motions to permit selected servicing operations to be performed on the process module, for example, while operations continue within the transport module.

FIG. 5A, viewed with FIG. 3, illustrates a flowchart 500 of method operations for servicing one of the process modules 206. An initial operation 502 causes the PM side door 222-1 to be opened and lowered as shown in FIG. 6A, thus bringing the valve body 212 to the same pressure as the process module 206. The process module 206 is then vented to atmospheric pressure. A next operation 504 is to remove lids 236 from the top of the valve vacuum body 212 and (not shown) from the process module 206a. Removal of the lid 236 (shown as a cut-away lid in FIG. 3) from the valve vacuum body 212 provides access to the interior of the valve vacuum body 212 as well as allowing manual access to the switches 408, 410 and 412. In an operation 506, a cleaning operation may be performed on the process module 206a. Such cleaning operation may include any of the above-noted service activities relating to a chamber. Then, in operation 508, the control switch 412 is set to "PM" to activate or condition the actuator 232-1 to operate the PM side door 222-1. In an operation 510, the control switch 410 is set to an UP position to cause the actuator 232-1 to raise the PM side door 222-1 from an initial DOWN position (away from the viewer in FIG. 3). Such raising moves the PM side door 222-1 toward the viewer in FIG. 3 to the UP position.

With the PM side door 222-1 in the UP position near the top of the valve vacuum body 212 (nearest the viewer in FIG. 3) and vertically aligned with the slot 218P, an operation 512 is performed to remove the PM side door 222-1 from the actuator 232-1. Such removal is by loosening fasteners (not shown) which normally secure the door 222-1 to the actuator 232-1. In the last aspects of the operation 512, a clean PM side door 222-1 is secured to the actuator 232-1. With the clean PM side door 222-1 in the UP and OPEN position toward the viewer in FIG. 3, a next operation 514 is to set the control switch 408 to the CLOSE switch position. This causes the actuator 232-1 to move the door 222-1 rightward as viewed in FIG. 3 such that the door 222-1 presses the O-ring 228 of the right door 222-1 against the seal surface 226. In initially securing the clean door 222-1 to the actuator 232-1, the fasteners (not shown) are left loose until the operation 514 is performed and the door 222-1 is moved to the right as described above. With the door 222-1 moved to the right so that the entire length of the O-ring 228 is compressed against the seal surface 226, such fasteners are tightly secured. In this manner, the tight securing by the fasteners is not performed until the door 222-1 is properly aligned with and sealed against the seal surface 226.

In an operation 516, the control switch 408 is set to an OPEN switch position to cause the actuator 232-1 to move the clean PM side door 222-1 to the OPEN position, whereupon in an operation 518, the control switch 410 is set to the DOWN position to cause the actuator 232-1 to lower the PM side door 222-1. Then, in an operation 520, the lids 236 are returned to both the process module 206 and to the valve vacuum body 212 to seal both units against the atmosphere. In an operation 522, a PM pump command is issued. This command causes the process module controller 402b to first make sure that the PM side door 222-1 is in the OPEN and DOWN positions. The process module 206 is then pumped down to a vacuum.

In operation 524 the control switches 410 and 408 are then set to the respective UP and CLOSE switch positions, causing the actuator 232-1 to raise the door 222 to the UP position. Upon completion of the raising portion of operation 524, the actuator 232-1 causes the door 222-1 to be moved to the right as viewed in FIG. 3 into the CLOSED position. As described above, such movement of the door 222-1 to the right causes the O-ring 228 to abut and be compressed by the seal surface 226 and effect a vacuum-tight seal. At this juncture, the clean PM side door 222-1 will work together with the opposite TM side door 222-2. The servicing of the process module 206 is DONE at operation 526.

Figure 5B:
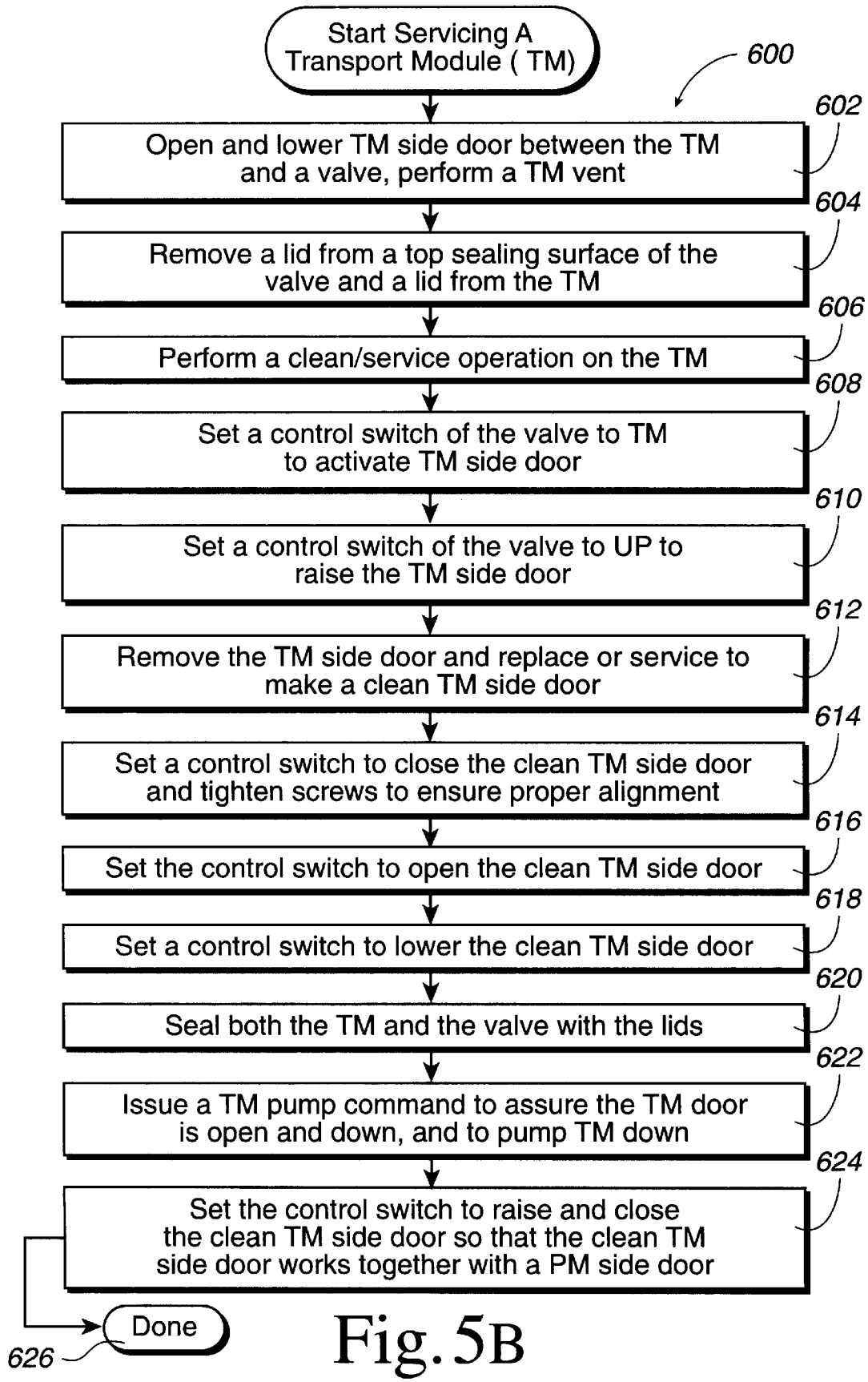
FIG. 5B depicts a flow chart illustrating the operations in a method of servicing a transport module that operates in conjunction with the process module, including controlling the movements of the first door and the second door of the valve to permit continued operations within the process module while the transport module is being serviced.

FIG. 5B, viewed with FIG. 3, illustrates a flowchart 600 of method operations for servicing one of the transport modules 206. An initial operation 602 causes the TM side door 222-2 to be opened and lowered, thus bringing the valve body 212 to the same pressure as the transport module 202. The transport module 202 is then vented to atmospheric pressure.

A next operation 604 is to remove the lids 236 from the top of the valve vacuum body 212 and (not shown) from the transport module 202. Removal of the lid 236 from the valve vacuum body 212 provides access to the interior of the valve vacuum body 212 as well as allowing manual access to the switches 408, 410 and 412. In an operation 606, a cleaning operation may be performed on the transport module 202. Such cleaning operation may include any of the above-noted service activities relating to a chamber. Then, in operation 608, the control switch 412 is set to "TM" to activate or condition the actuator 232-2 to operate the TM side door 222-2. In an operation 610, the control switch 410 is set to an UP switch position to cause the actuator 232-1 to raise the TM side door 222-2 from an initial DOWN position (away from the viewer in FIG. 3). Such raising moves the TM side door 222-2 toward the viewer in FIG. 3 to the UP position.

With the TM side door 222-2 in the UP position near the top of the valve vacuum body 212 (nearest the viewer in FIG. 3) and vertically aligned with the slot 218T, an operation 612 is performed to remove the TM side door 222-2 from the actuator 232-2. Such removal is also by loosening fasteners (not shown) which normally secure the door 222-2 to the actuator 232-2. In the last aspects of the operation 612, a clean TM side door 222-2 is secured to the actuator 232-2. With the clean TM side door 222-2 in the UP and OPEN position toward the viewer in FIG. 3, a next operation 614 is to set the control switch 408 to the CLOSE switch position. This causes the actuator 232-2 to move the door 222-2 to the left as viewed in FIG. 3 such that the door 222-2 presses the O-ring 228 of the left door 222-2 against the seal surface 226. As described with respect to the clean door 222-1, in initially securing the clean door 222-2 to the actuator 232-2, the fasteners (not shown) are left loose until the operation 614 is performed, the door 222-2 is moved to the left to compress the entire length of the O-ring 228 against the seal surface 226. The fasteners are tightly secured In an operation 616, the control switch 408 is set to an OPEN switch position to cause the actuator 232-2 to move the clean TM side door 222-2 to the OPEN position, whereupon in an operation 618, the control switch 410 is set to the DOWN position to cause the actuator 232-2 to lower the TM side door 222-2. Then, in an operation 620, the lids 236 are returned to both the transport module 202 and to the valve vacuum body 212 to seal both units against the atmosphere.

In an operation 622, a TM pump command is issued. This command causes the transport module controller 402a to first make sure that the TM side door 222-2 is in the OPEN and DOWN positions. The transport module 202 is then pumped down to a vacuum.

In operation 624 the control switch 408 is then set to the CLOSE switch position, causing the actuator 232-2 to, upon completion of the raising portion of operation 624, cause the door 222-2 to be moved to the left as viewed in FIG. 3 into the CLOSED position. Such movement of the door 222-2 to the left causes the O-ring 228 to abut and be compressed by the seal surface 226 and effect a vacuum-tight seal. At this juncture, the clean TM side door 222-2 will work together with the opposite PM side door 222-1. The servicing of the transport module 202 is DONE at operation 626.

As described above, the two actuators 232 include an actuator 232-1 corresponding to the door 222-1. The actuator 232-1 may be operated separately from the other actuator 232-2 that corresponds to the door 222-2. Each of the actuators 232 is the same as the other actuator 232, except for the rotational orientation of the door 222 carried by the respective actuator 232. In particular, the actuators 232-1 shown in FIGS. 6A–6C, the doors 222-1 are on the right as viewed in FIGS. 6A–6C for operation with respect to the process module 206, for example. The actuators 232-2 shown in FIGS. 6D and 6E have the doors 222-2 on the left as viewed in FIGS. 6D and 6E for operation with respect to the transport module 202, for example. Thus, for efficiency of description, primary attention is directed to the actuator 232-1 shown in FIGS. 6A–6C, and additional details are described with respect to FIGS. 6D and 6E.

Figure 6B:
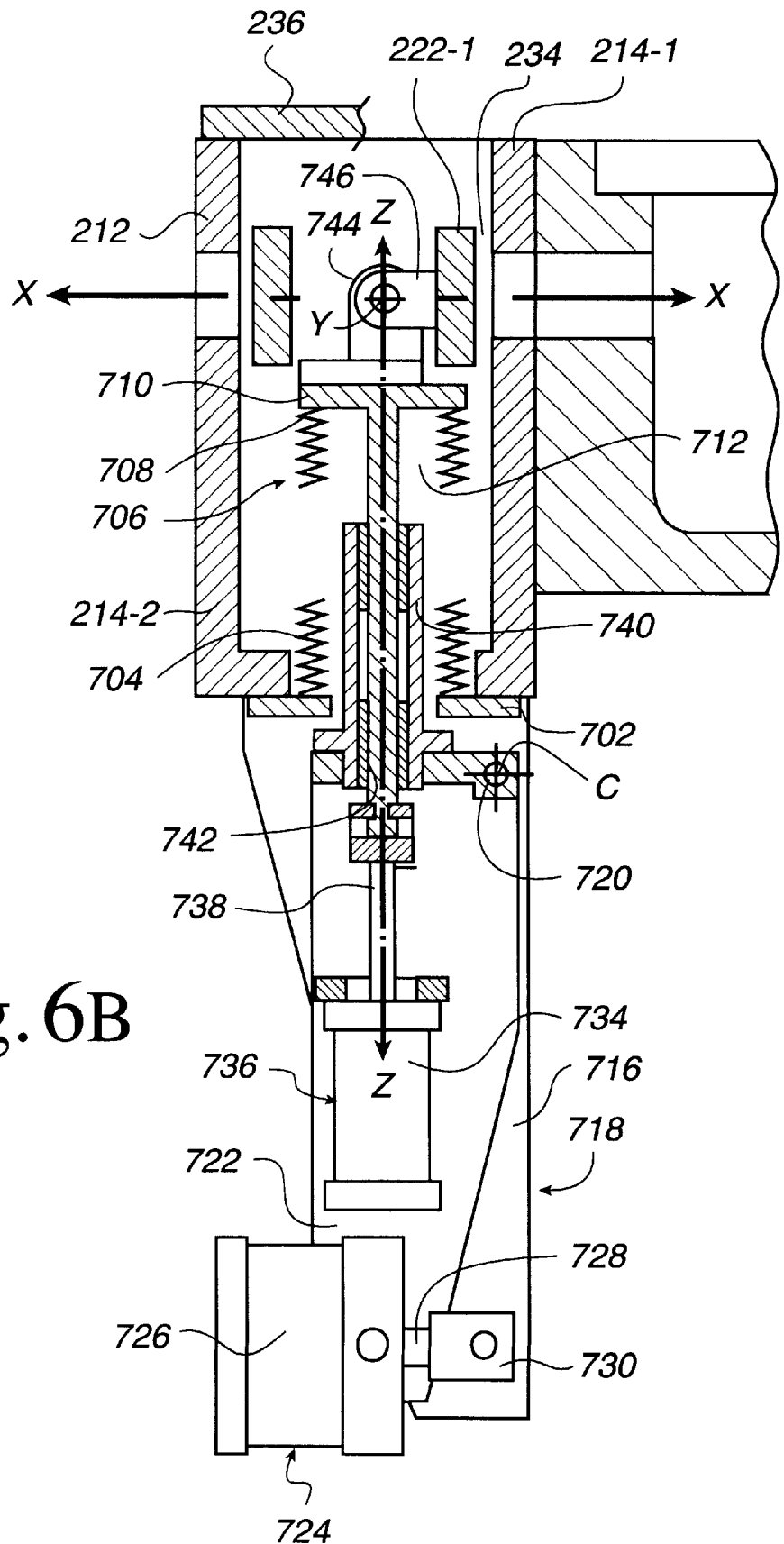
FIG. 6B is a vertical cross-sectional view similar to FIG. 6A showing the one valve of the present invention in an OPEN and UP position to facilitate servicing of the door associated with the one valve.
Figure 6C:
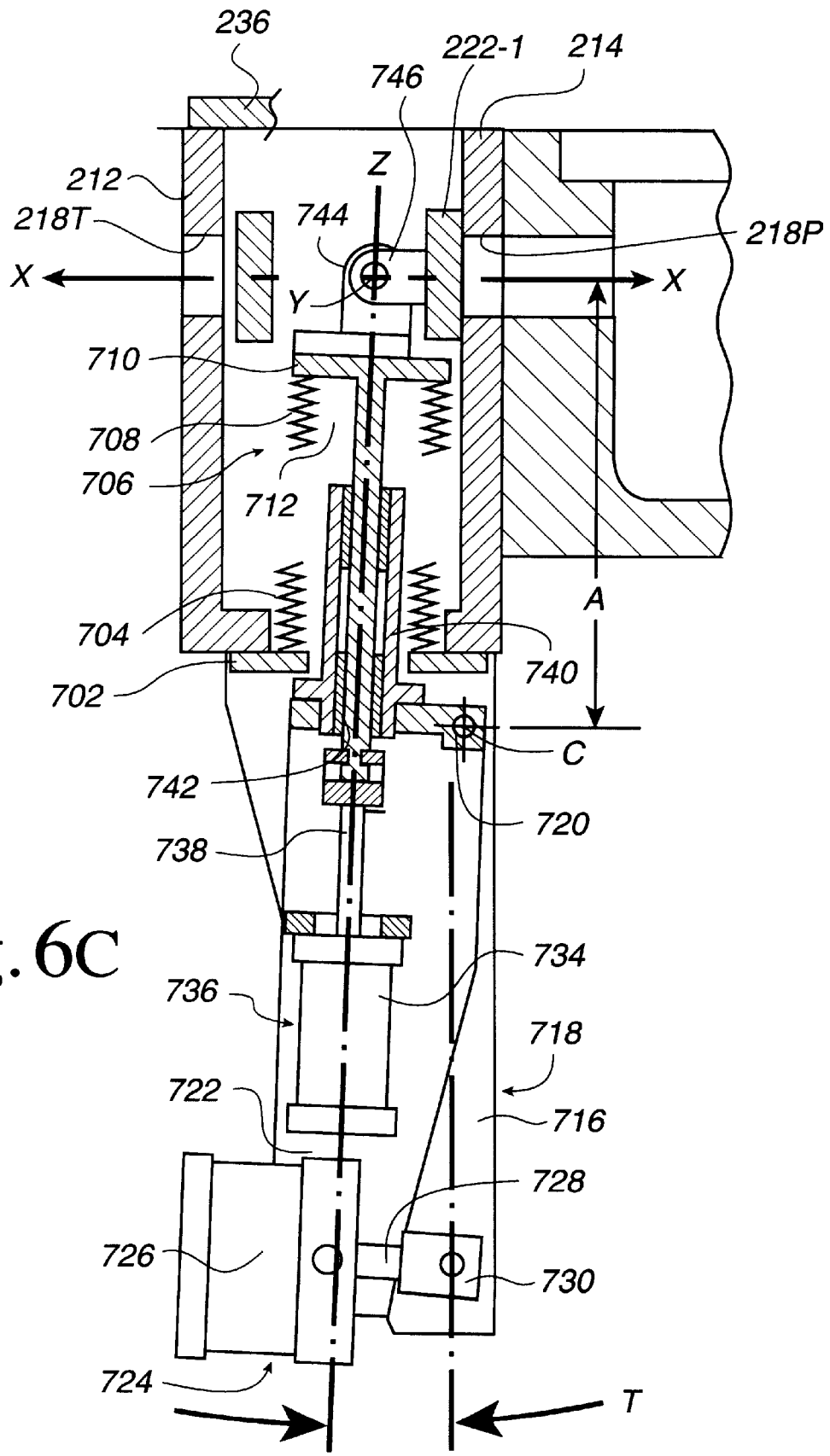
FIG. 6C is a vertical cross-sectional view similar to FIGS. 6A and 6B showing the one valve of the present invention in an UP and CLOSED position to close the slot associated with the one valve.
Figure 7:
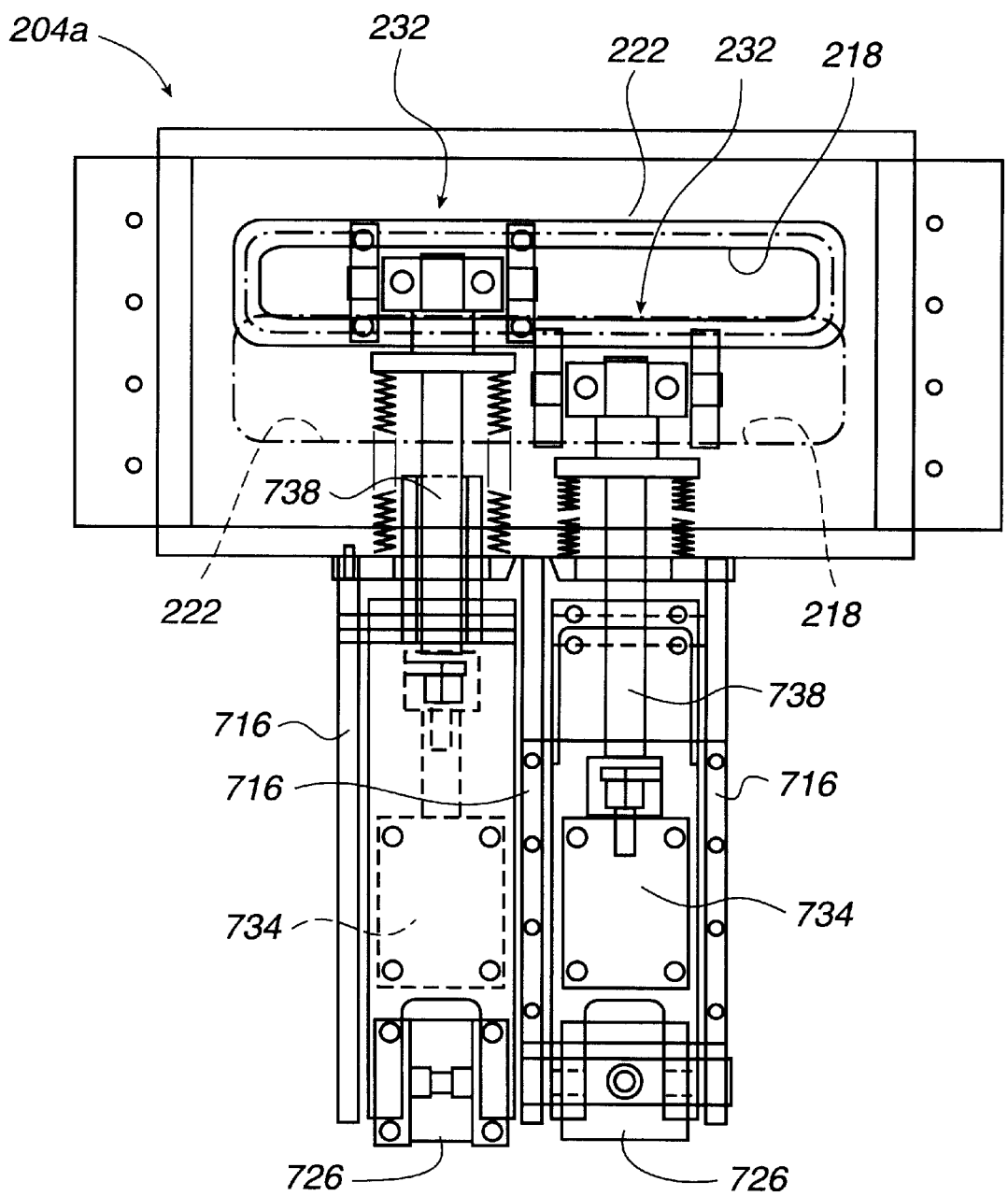
FIG. 7 is a schematic view taken along line 7—7 in FIG. 6D showing the actuator shafts for each slot valve offset in side-by-side relationship along the Y-axis so as to reduce the width of the valve vacuum body, and thus reduce the footprint of the semiconductor process cluster architecture that includes the dual sided slot valve of the present invention.

Referring to FIGS. 6A–6C, the X-axis designates the arcuate path along which the door 222-1 moves (e.g., in operation 516) from the CLOSED position shown in FIG. 6C to the left to the OPEN position shown in FIG. 6B. The X-axis may be generally perpendicular to the plane of the wall 214. Although the path of the doors 222-1 and 222-2 is arcuate relative to a cradle axis-C, the radius of the arc is large enough that the OPEN position of the door 222-1 may be said to be perpendicular to and away from the right side wall 214-1 of the body 212, and may be said to be perpendicular to and away from the left side wall 214-2 of the body 212. In the OPEN position, the door 222-1 defines the space 234 between the door 222-1 and the wall 214. With the door 222-1 in the OPEN position, the easy access to the valve 204 for service, as noted above, is provided. The advantage of initially allowing easy access to the valve 204 in the OPEN and UP position shown in FIG. 6D, which position is not vertically down (i.e., not laterally-spaced), relative to the right PM slot 218P is that in the OPEN and UP position the door 222-1 of the valve 204 may be reached by a gloved hand (not shown) of a service worker for service.

The Z-axis corresponds to the above-referenced vertical, or lateral, direction or spacing, and is also shown in FIGS. 6A–6C. The Z-axis is the axis of the actuator 232-1 along which the door 222-1 moves into the UP and DOWN positions relative to the PM port 218P. Comparing FIG. 6B to FIG. 6C, it may be appreciated that the Z-axis moves, and in particular, rotates on the cradle axis C from a vertical orientation (FIG. 6B) to a tipped orientation (FIG. 6C) at an angle T with respect to vertical. The change in orientation around the C-axis and the distance A from the C-axis to the door 222-1 result in the door 222-1 moving from the CLOSED position, FIG. 6C (at which the O-ring touches the seal surface 226), to the OPEN position, FIG. 6B, separated by the space 234 from the wall 214-1.

The actuator 231-1 includes the upper valve vacuum body 212 mounted on top of a bottom plate 702. The body 212 has the slots 218P and 218T aligned with the X-axis, and is adapted to be sealed by the lid 236. A lower end 704 of a bellows 706 is sealingly attached to the bottom plate 702 and an upper end 708 of the bellows 706 is sealingly attached to a bellows plate 710. With the bellows 706 sealed to the bottom plate 702 and to the bellows plate 710, and with the lid 236 sealed to the top of the valve vacuum body 212, the body 212 is strong enough to resist the forces of a vacuum applied through the slot 218P, for example. The bellows 706 has a hollow cylindrical shape defining a cavity 712.

The bottom plate 702 carries three spaced arms 716 of a first, or, pivot, frame 718. One arm 716 is shown in FIGS. 6A–6C extending downwardly from the bottom plate 702 below the bellows 706. Another one of the arms 716 extends parallel to the one arm 716 and supports a pivot pin 720 that is centered on the C-axis. The pivot pin 720 provides a rotary mount for a cradle 722 that is suspended from the pin 720 for rocking motion around the C-axis. The rocking motion is provided by a first pneumatic motor 724 having an open/close cylinder 726, and a piston rod 728. One end, a distal end 730, of the rod 728 is secured to the arms 716 so that when the rod 728 is retracted or extended the cradle 722 respectively rotates counterclockwise or clockwise on the C-axis. The retracted rod position shown in FIG. 6B corresponds to, and causes, the OPEN position of the door 222-1 (operation 516, for example) since the rod 728 causes the cradle 722 to rock counterclockwise on the pin 720. The extended rod position shown in FIG. 6C corresponds to, and causes, the CLOSED position of the door 222-1 (operation 522, for example) since the rod 728 causes the cradle 722 to rock clockwise on the pin 720.

The cradle 722 also supports an up/down cylinder 734 of a second, or up/down motor 736. With the cylinder 734 fixed to the cradle 722, a piston rod 738 may be extended or retracted and slides through a hollow guide tube 740 mounted in an aperture 742 of the cradle 722 adjacent to the pivot pin 720. The bellows 706 has the cavity 712 with a hollow cylindrical shape for receiving the piston rod 738 and the piston rod guide tube 740. As shown in FIGS. 6A–6C, the piston rod guide tube 740 allows the piston rod 738 of the second, or up/down, motor 736 to be extended or retracted and correspondingly move the bellows plate 710. The bellows plate 710 carries an actuator link 744 which supports a pair of door mount arms 746 for rotation on the Y-axis. The arms 746 are secured to the door 222-1 via the fasteners described (but not shown) above. The door mount arms 746 are attached to the door 222-1 off-center with respect to a mid-point of the door 222-1 (as best indicated by a line 748 in FIG. 3), such that neither of the doors 222-1 and 222-2 is centered about the longer side (or Y-axis dimension) of each respective door 222. As a result of the off-center mounting of the doors 222 to the actuators 232, the combined width of the actuators 232 may be substantially less than twice the diameter of any one of the actuators 232. In practice, the width W of the body 212 need only be about 6.625 inches, which is only a one hundred fifty percent (150%) increase in the width W as compared to the width of only one actuator 232.

It may be understood from FIGS. 6A and 6C that when the rod 738 of the up/down motor 736 is extended in operation 510, for example, the door 222-1 is in the UP position (FIG. 6C) with the bellows 706 extended to maintain the vacuum, for example, in the process module 206. When the rod 738 of the up/down motor 736 is retracted in operation 518, for example, the door 222-1 is moved into the DOWN position (FIG. 6A) with the bellows 706 retracted to maintain the vacuum, for example, in the process module 206.

It may be understood then, that the actuator 232, with the separate motors 724 and 736, operates to separately move the door 222-1 in the first direction of the X-axis generally perpendicular to the respective first and second walls 214-1 and 214-2 of the body 212, and to move the door 222-1 in a second direction generally parallel to the walls 214 of the body.

The unmet needs of the prior art cluster architecture 100 are filled by the above-described dual sided slot valve 204a in the vacuum body 212 between the adjacent modules 206 and 202. As described, the separate valve actuators 232 are provided for each of the two valve body slots 218, such that the slot 218 on one side of the body 212 may be separately closed or opened by one of the doors 222 independently of the other cooperating slot 218. The separate doors 222 and door actuation via the separate actuators 232-1 and 232-2 facilitate maintaining a vacuum, for example, in the transport module 202 while the adjacent process module 206a is opened to the atmosphere to allow servicing to be performed. As a result, substantial periods of downtime are avoided in that no pump down cycle is needed to bring the transport module 202 to a desired vacuum after servicing the process module 206a, and no other operations need be performed on the transport module 202 due to the servicing of the process module 206a.

Further, the dual sided slot valve 204a is provided with these advantages while initially allowing the easy access to the door 222 in the OPEN and UP position for performing service on the door 222. Such easy access is provided by the motors 724 and 736 which stop the door 222-1, for example, in the OPEN and UP position, but not vertically-spaced in the direction of the Y-axis relative to the slot 218P associated with the door 222-1. In the OPEN and UP positions the door 222 may be reached by a gloved hand of a service worker for service. The separate motor 736 then causes the door 222 to move laterally away from the OPEN and UP positions and away from the slot 218 to expose the sealing surface 234 around the slot 218, which permits cleaning of the sealing surface 234, for example. Due to the distance of the vertically-moved door 222 from the access opening (which is normally closed by the lid 236), it is very difficult for the glove of the worker to reach the door 222 in the DOWN position for service after the downward movement in the direction of the Y-axis. In the vertically-moved position (moved to the DOWN position), however, the door 222 does not interfere with the ability to clean around the valve door 222, including the surface 226 against which the door 222 seals. Additionally, the actuator shafts 738 for each of the doors 222 may be positioned relative to each other in the offset manner shown in FIG. 3 so as to reduce the distance, or width W, occupied by the valve vacuum body 212 between the adjacent transport and process modules 202 and 206, respectively, for example.

B. System Architecture and Operation

Figure 8:
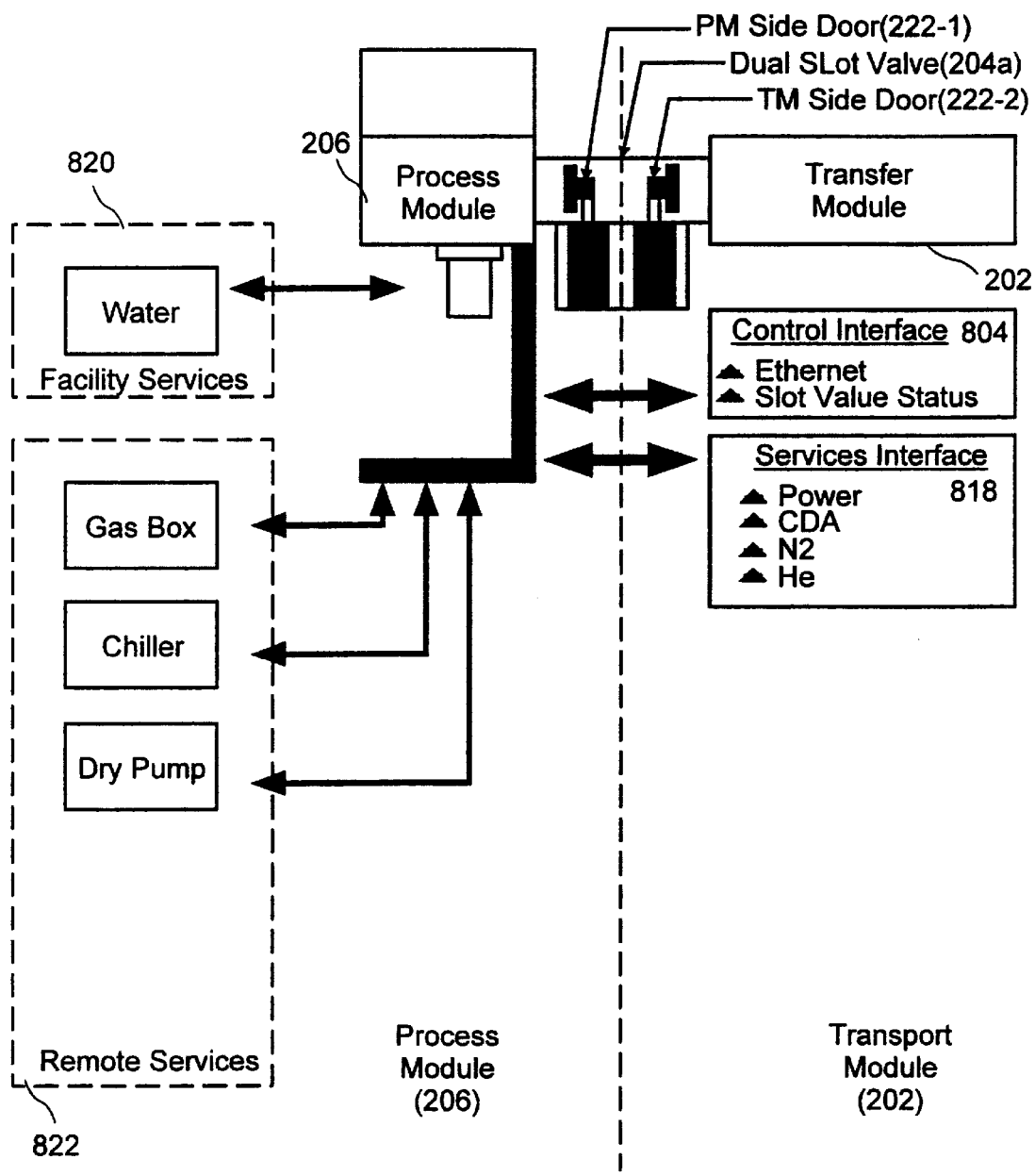
FIG. 8 is a schematic diagram of a system for controlling certain operations of the transport module and the process modules, including various interfaces between the transport module and a representative one of the process modules, and the services controlled by such modules.
Figure 9:
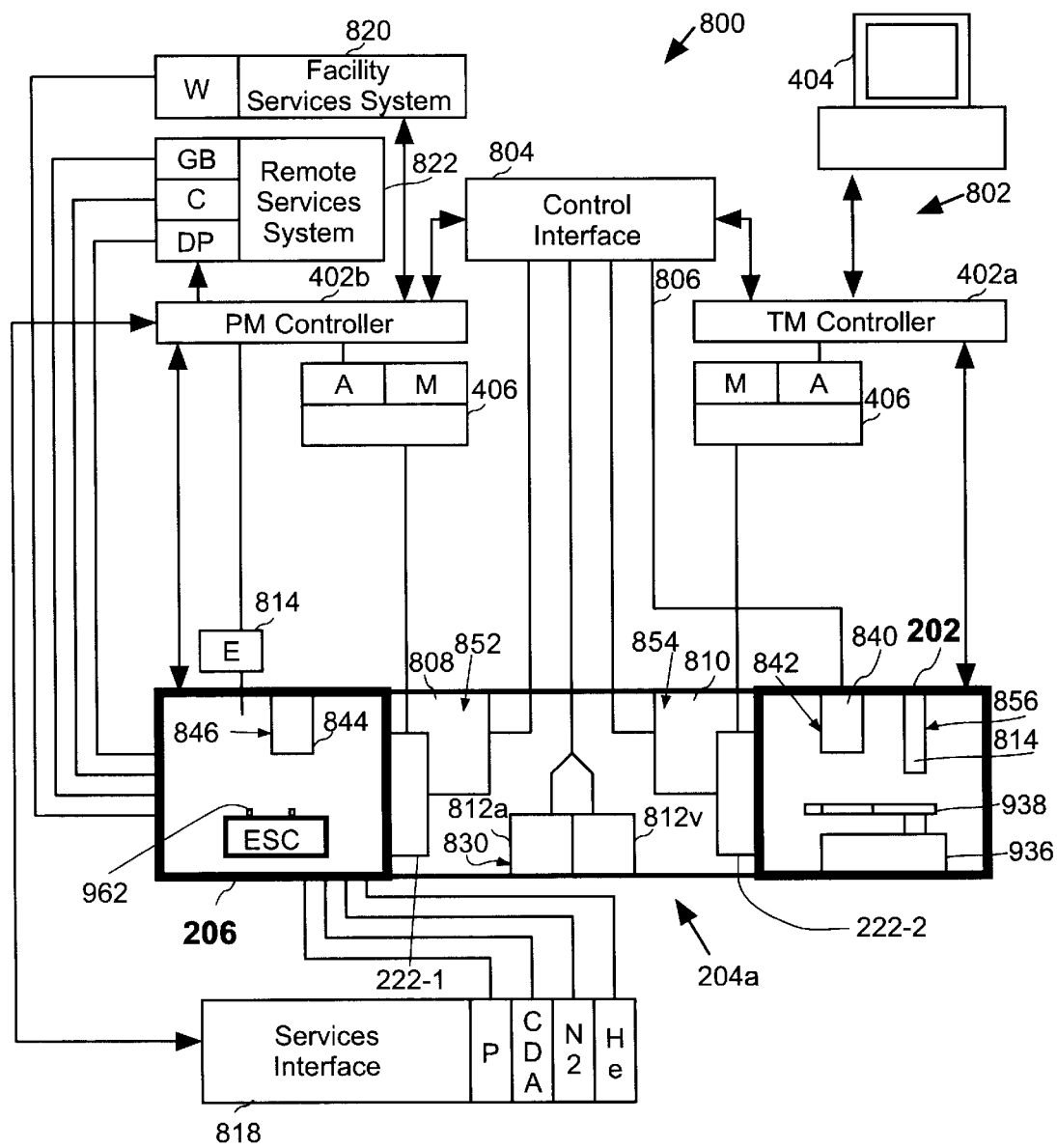
FIG. 9 is a schematic diagram of the system for controlling the operations of the transport module and the process modules in preparation for a normal operational state of the process module.

FIGS. 8–22 are directed toward the overall system architecture and operation of such architecture, in accordance with the present invention. FIGS. 8 and 9 show embodiments of the present invention including a control system 800 for a cluster tool architecture 802. The architecture 802 includes the transport module (or "TM") 202, the process module (or "PM") 206, and a valve between the modules 202 and 206, wherein the valve may be one of the dual sided slot valves 204a. The control system 800 contemplates that the process module 206 has many states, or operating conditions. For example, in a "normal" state the module 206 is capable of processing wafers as intended within the scheme of the cluster tool architecture 802, e.g., under full power and system control for such processing operations as transformer coupled plasma (TCP) substrate etching, layer depositions, and sputtering. In the normal state, the operations within one of the modules 206 directly affect the operations of the module 202, or another of the modules 206, for example. The control system 800 is used, for example, for controlling the operations of the transport module 202 and the process modules 206 in preparation for the normal operational state of the process module 206.

In a "maintenance" state the module 206 is under full power, and all of the functions may be performed as intended within the scheme of the cluster tool architecture 802. However, in the maintenance state of the processing module 206, the TM controller 402a does not attempt to transfer wafers to the module 206, and does not respond to certain signals from the module 206. As described below, the control system 800 is used, for example, for controlling the operations of the transport module 202 and the process modules 206 in preparation for the maintenance state of the process module 206. The module 206 is also controlled by the control system 800 to operate under local control that permits certain maintenance functions to be exercised, e.g., for problem diagnosis, cleaning, or testing, for example. In the maintenance state skilled technicians monitor the system performance since the module 206 is under power.

In a "locked out" state the module 206 is not powered, and cannot be operated under the control of the control system 800. Thus, none of the operational process functions may be performed as intended within the scheme of the cluster tool architecture 802. Instead, the dual sided slot valve 204a may be operated under manual control. Further, as described below, all forms of hazardous energy and materials are physically locked out according to an approved locked out-tagged out (LOTO) procedure. For example, a tool physically has a lock on the "off" switch and a tag indicating who set the lock "on." This permits module 206 to be serviced safely, including via operations described above with respect to FIG. 5a.

The control system 800 includes the TM controller 402a that is connected to and controls the operation of the transport module 202. The TM controller 402a is also connected to the TM side of the valve 204a for controlling the door 222-2. A PM controller 402b is connected to, and controls, the operation of the process module 206. The PM controller 402b is also connected to the PM side of the valve 204a for controlling the door 222-1. The controllers 402a and 402b are connected to each other through a control interface 804, which is essentially a logical interface as opposed to a physical interface. The TM controller 402a receives commands from a computer workstation, or tool controller 404. The control interface 804 also communicates commands and other signals, data, etc. between the TM controller 402a and the PM controller 402b. The control interface 804 also provides the connection to a slot valve status line 806 and to two door position sensors 808 and 810 of the dual slot valve 204a for the respective PM and TM side doors 222-1 and 222-2. The control interface also provides a connection to a pressure sensor 812 that senses the pressure in the valve body 212.

The controllers 402a and 402b interface with the respective TM side and the PM side of the valve 204a via an electronics unit 406 which has two operational positions for each of the module 202 and 206. One position is "A," representing an automatic position for operation of the module 202 under the control of the TM controller 402a, and operation of the module 206 under the control of the PM controller 402b. The other position is "M," representing a manual operational position for operation of the respective modules 202 and 206 under manual control.

As described above, FIG. 4B shows the "M" aspects of the electronics unit 406 wherein the top is provided with a series of manually operable switches 408, 410, and 412, which are respectively for manually controlling the movement of the doors 222 into the OPEN and CLOSED positions, for manually controlling the movement of the doors 222 into the DOWN and UP positions, and for manually selecting which of the modules 202 and 206 is to be serviced (e.g., process module 206 is "PM"; and transport module 202 is "TM"). Examples of the signals 414 and 416 transmitted between respective ones of the controller 402a and 402b and the slot valve 204a are "Open Door," "Close Door," and "Door Enable." Other aspects of the control interface 804 include sensors for the process module 206, including a wafer sensor 814 for determining that the module 206 is "empty," which means that there is no wafer in the module 206 to be processed. The PM controller 402b is configured to indicate when the process sequence has been completed. Via a services interface 818, the process module controller 402b also cooperates with a facility services system 820 and a remote services system 822 that provide to the module 206 materials and service that are unique to the operations in the module 206. For example, the facility services system 820 may provide water, and the remote services system 822 may provide gas box (GB), chiller (C) and dry pump (DP) services, for the module 206. These services of the facility services system 820 and the remote services system 822 are controlled only by the services interface 818, and not by the transport module controller 402a, for example. The resources provided under the control of the services interface 818 are shared by all process modules 206.

In a general sense, then, the control system 800 provides, or functions with, interfaces between the modules 202 and 206. Such interfaces include the mechanical interface 830 provided by the dual slot valve 204a; the system control interface provided by the control interface 804 for coordinating the operations of the modules 202 and 206; and the services interface 818 of the control system 800 for controlling the supply of resources, such as power (P), clean dry air (CDA), N2 and He. Additionally, interlocks are provided for coordinating the operations of the modules 202 and 206. For example, a TM pressure sensor 840 provides an interlock 842 described below with respect to FIGS. 13 and 15, a PM pressure sensor 844 provides an interlock 846 described below with respect to FIGS. 15 and 19, the PM door position sensor 808 and the TM door position sensor 810 provide respective interlocks 852 and 854 (the interlock 854 being described below with respect to FIG. 15), and the wafer sensor 814 provides an interlock 856 described below with respect to respective FIGS. 18 and 17.

Figure 11:
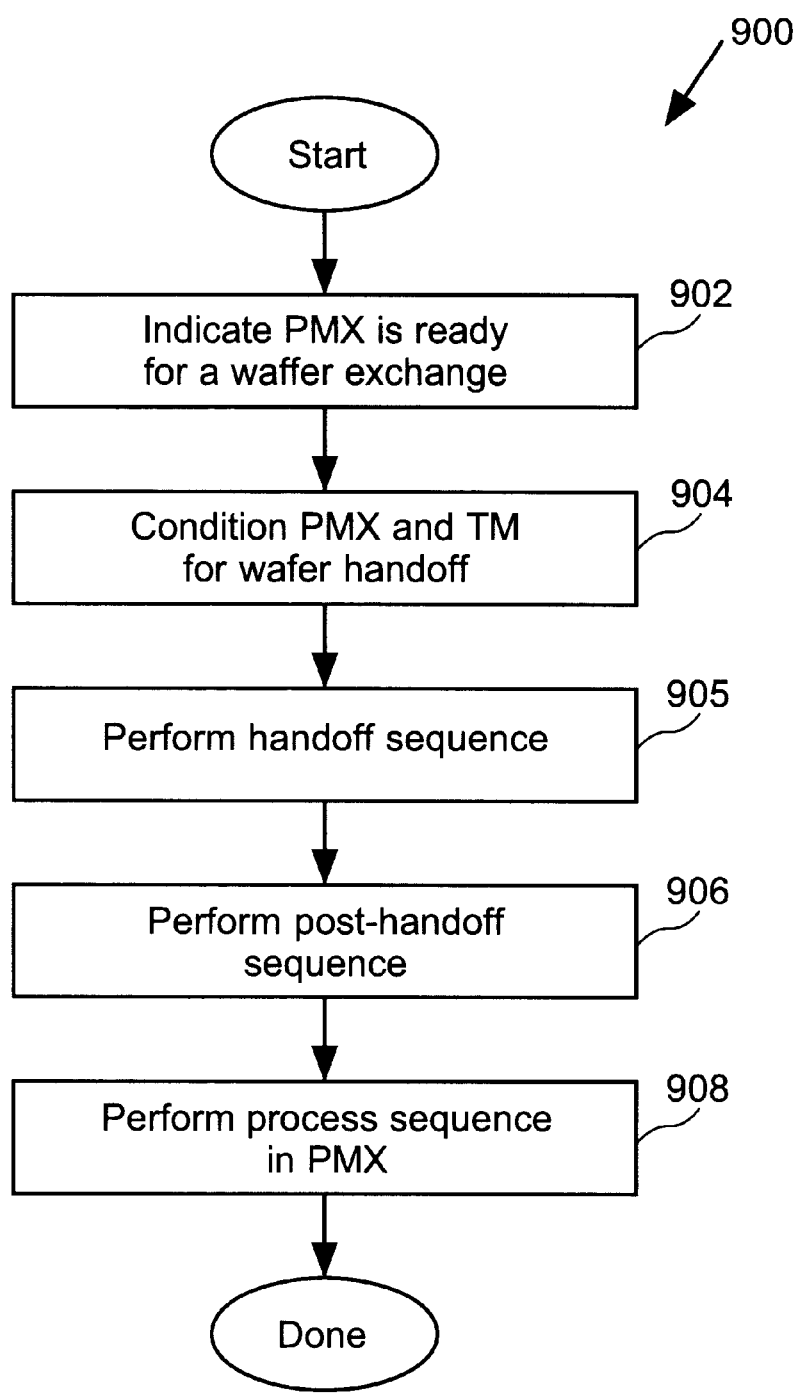
FIG. 11 depicts a flowchart illustrating operations in a method of controlling preparation of the transport module and a selected process module for a normal operational state of the selected process module.

Preparation of the processing module 206 for operation in the normal state is illustrated in FIG. 11, viewed with FIGS. 8 and 9, in terms of a flowchart 900 of method operations for such preparation. At this juncture the PM 206 is operating under the control of the local PM controller 402b, with the functions of the other PMs 206 being coordinated by the TM controller 402a through the control interface 804. In an initial operation 902, the selected PM 206 indicates that it is ready to process a next wafer. Such ready condition is based on the PM 206 being empty (no wafer) as indicated by the sensor 814, or the PM 206 having completed a next prior processing. The ready indication is sent to the control interface 804 via the PM controller 402b. In operation 904 each of the PM 206 and the TM 202 is conditioned for wafer "handoff", i.e., preparing for a transfer of the wafer from the transport module 202 to the process module 206. Next, an operation 905 causes a handoff sequence to be performed, i.e., a transfer of the wafer from the transport module 202 to the process module 206. The handoff sequence is followed by an operation 906 which causes a post-handoff sequence to be performed, i.e., sequencing after the wafer transfer. Then, with the wafer in the process module 206, operation 908 performs processing in the PM 206.

Figure 12:
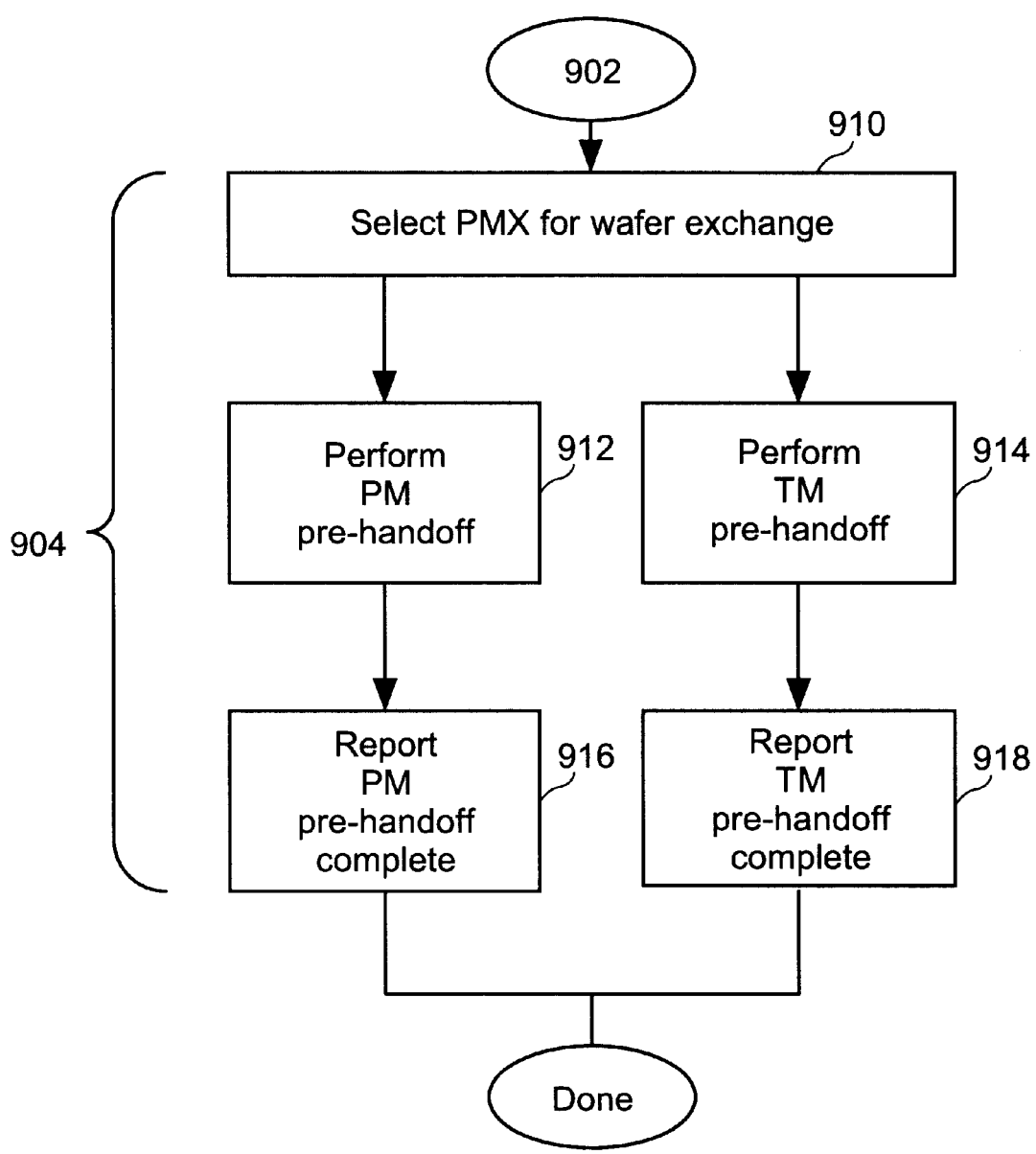
FIG. 12 depicts a flowchart illustrating certain of the FIG. 11 operations in the method of controlling preparation of the transport module and the selected process module for operation in the normal state, wherein the certain operations are preparatory for transfer of a wafer between the modules ("pre-handoff" situation).

In more detail, FIG. 12 illustrates a flowchart depicting operation 904 following operation 902. Operation 904 includes the following suboperations. In operation 910 the PM 206 that is to receive the next wafer is selected, e.g., PMX is selected. Asynchronously, the PM controller 402b and the TM controller 402a perform respective operations 912 and 914, in which pre-handoff operations are performed. In respective operations 916 and 918, completion of the respective PM 206 and TM 202 pre-handoff is reported.

Figure 13:
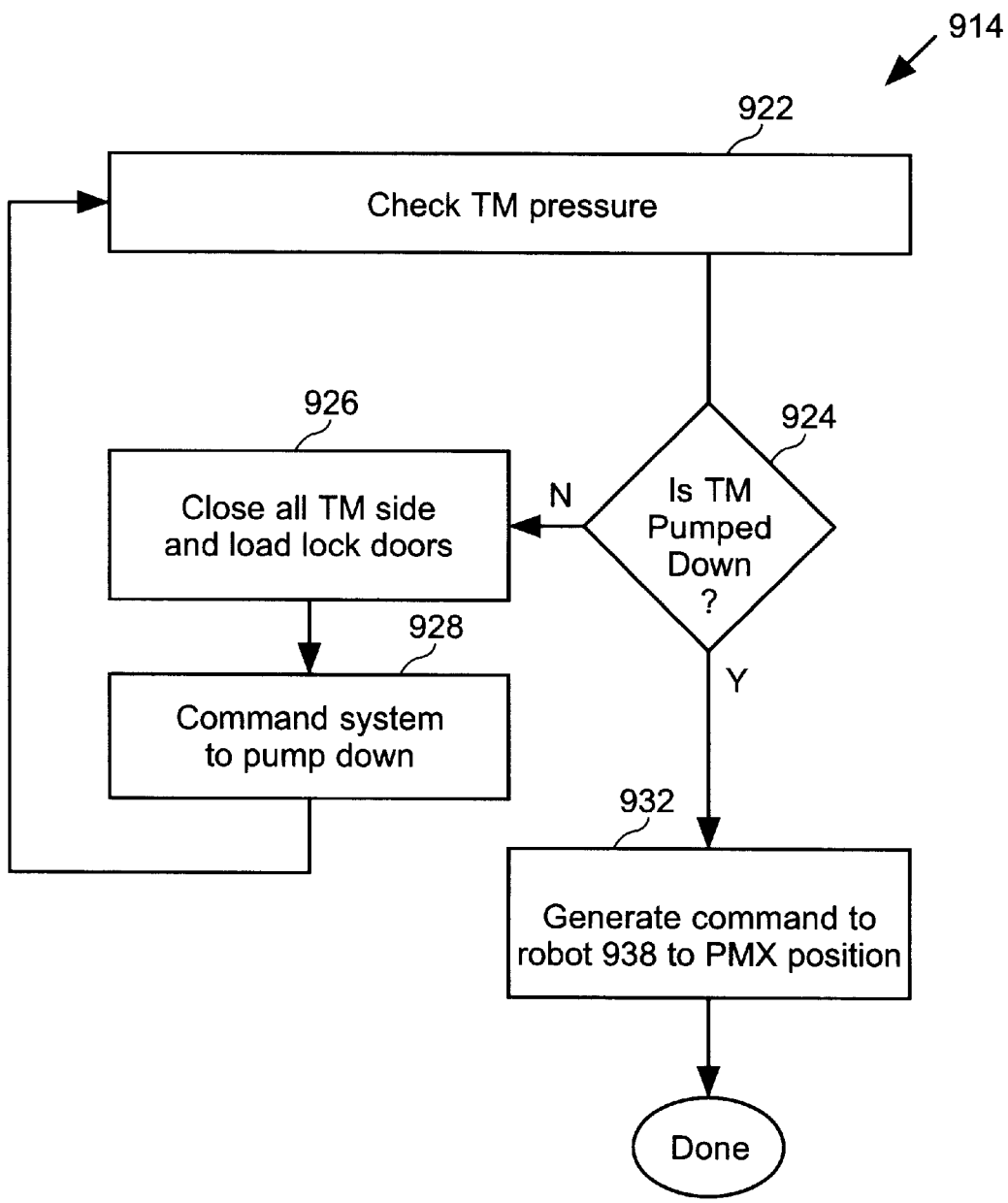
FIG. 13 depicts a flowchart illustrating details of one operation shown in FIG. 12 for the pre-handoff situation of the transport module.

In more detail, FIG. 13 illustrates a flowchart depicting the suboperation of operation 914 of FIG. 12, in accordance with one embodiment of the present invention. Operation 922 determines the pressure inside the TM 202. In operation 924, it is determined whether the TM 202 is pumped down to vacuum. If it is not pumped down to vacuum, the method will advance to an operation 926 where all TM side doors 222 and load lock doors are closed. Then, operation 928 commands that the TM be pumped down to vacuum, and the method loops back to operation 922. If operation 924 determines that the TM 206 was pumped down to vacuum, the method will move to operation 932 where a command to a robot 936 (FIG. 9) is generated to move an end effector 938 for the selected PM 206 to a PMX position. In the PMX position, the robot 936 is in position to transfer the wafer to the selected PM 206, namely PMX.

Figure 14:
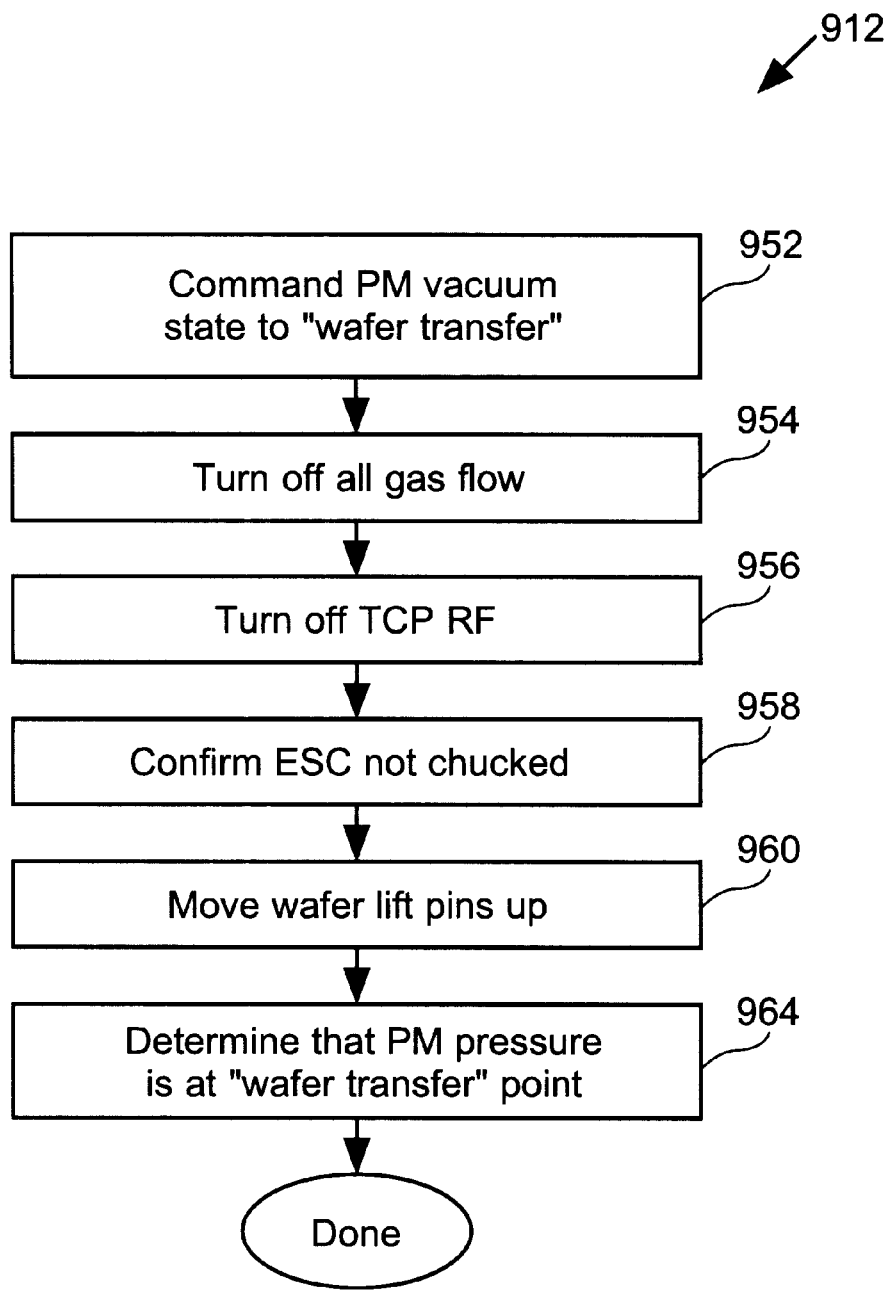
FIG. 14 depicts a flowchart illustrating details of one operation shown in FIG. 12 for the pre-handoff situation of the process module.

Continuing the description of the preparation of the processing module 206 for operation in the normal state, FIG. 14 illustrates a flowchart depicting operation 912 as including suboperations. For example, an operation 952 commands the PM 206 state to "wafer transfer." Then, a series of operations 954, 956, and 958 respectively turn off all gas flow, turns off a transformer coupled plasma, and confirms that the electrostatic chuck (ESC) has not been chucked. Then in operation 960 wafer lift pins 962 on the ESC 938 are moved up to support the wafer. In operation 964 it is determined that the pressure in the selected PM 206 is at the wafer transfer point, as indicated by the sensor 844. That is, that such pressure is at vacuum.

Figure 15:
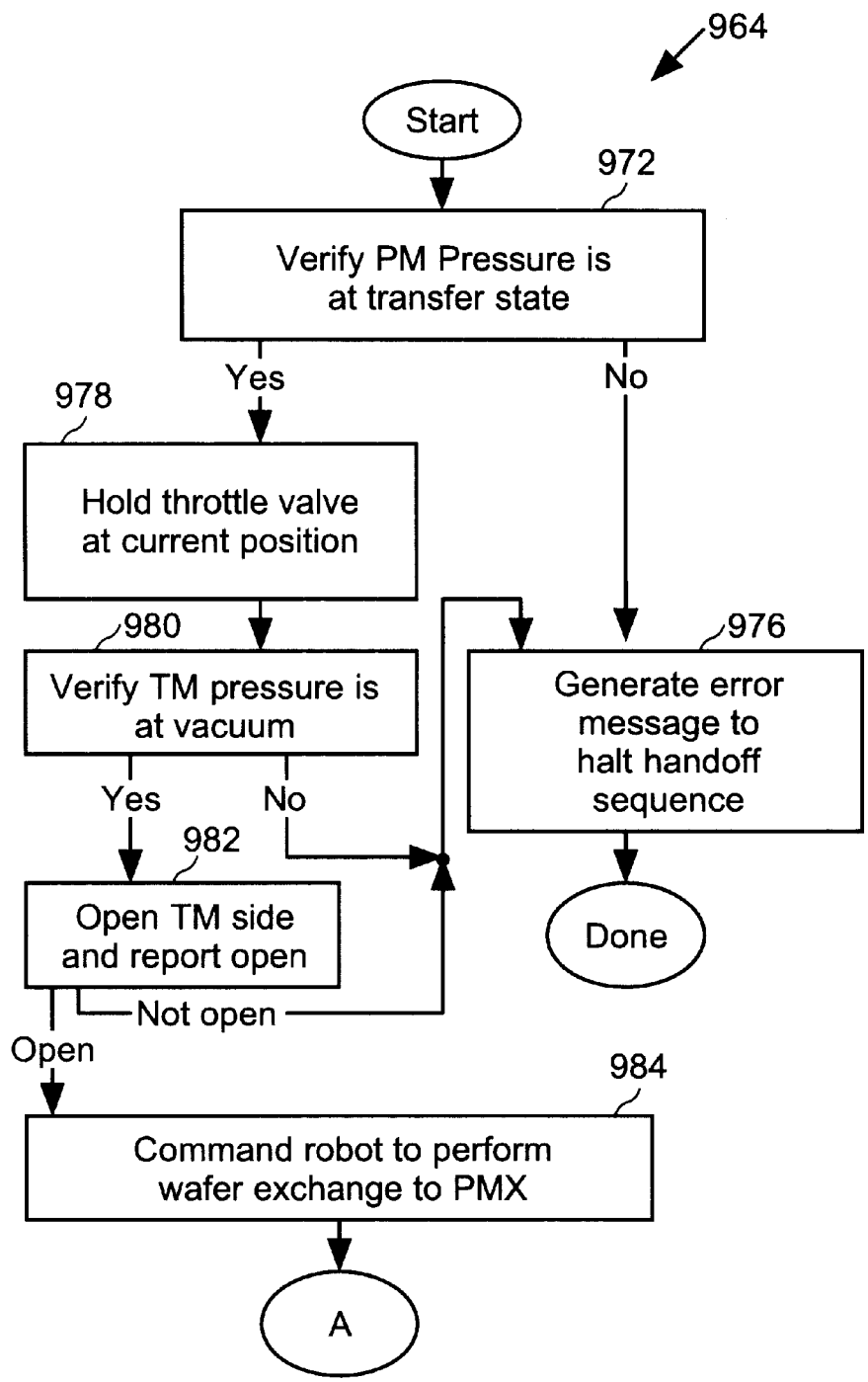
FIGS. 15 and 16 depict a flowchart illustrating details of one operation shown in FIG. 11 for transfer of a wafer between the modules ("handoff" situation).

The determination 964 as whether the PM 206 is at the wafer transfer point is described in more detail in a flowchart of FIG. 15, in accordance with one embodiment of the present invention. The pressure sensor 840 may be used for determining this PM pressure. An operation 976 is configured to generate an error message to halt the handoff sequence if the pressure is not at the transfer state. If the operation 972 verifies that the pressure in the selected PM 206 is at the transfer state, a "yes" branch is taken to operation 978 in which the throttle valve is held at the current position. Then, via the TM pressure sensor 840 and the TM pressure interlock 842, operation 980 verifies that the TM 202 pressure is at vacuum. If such TM pressure is not at vacuum, a "no" branch is taken to operation 976. If such TM pressure is at vacuum, a "yes" branch is taken to operation 982 to open the TM side door 222-2. Via the TM door sensor 810 and the interlock 854, operation 982 reports whether the TM door 222-2 is open. If it is not open, a "not open" branch is taken to operation 976. If is open, an "open" branch is taken to operation 984, wherein a command is issued to the robot 936 to perform a wafer exchange into the PMX.

Figure 16:
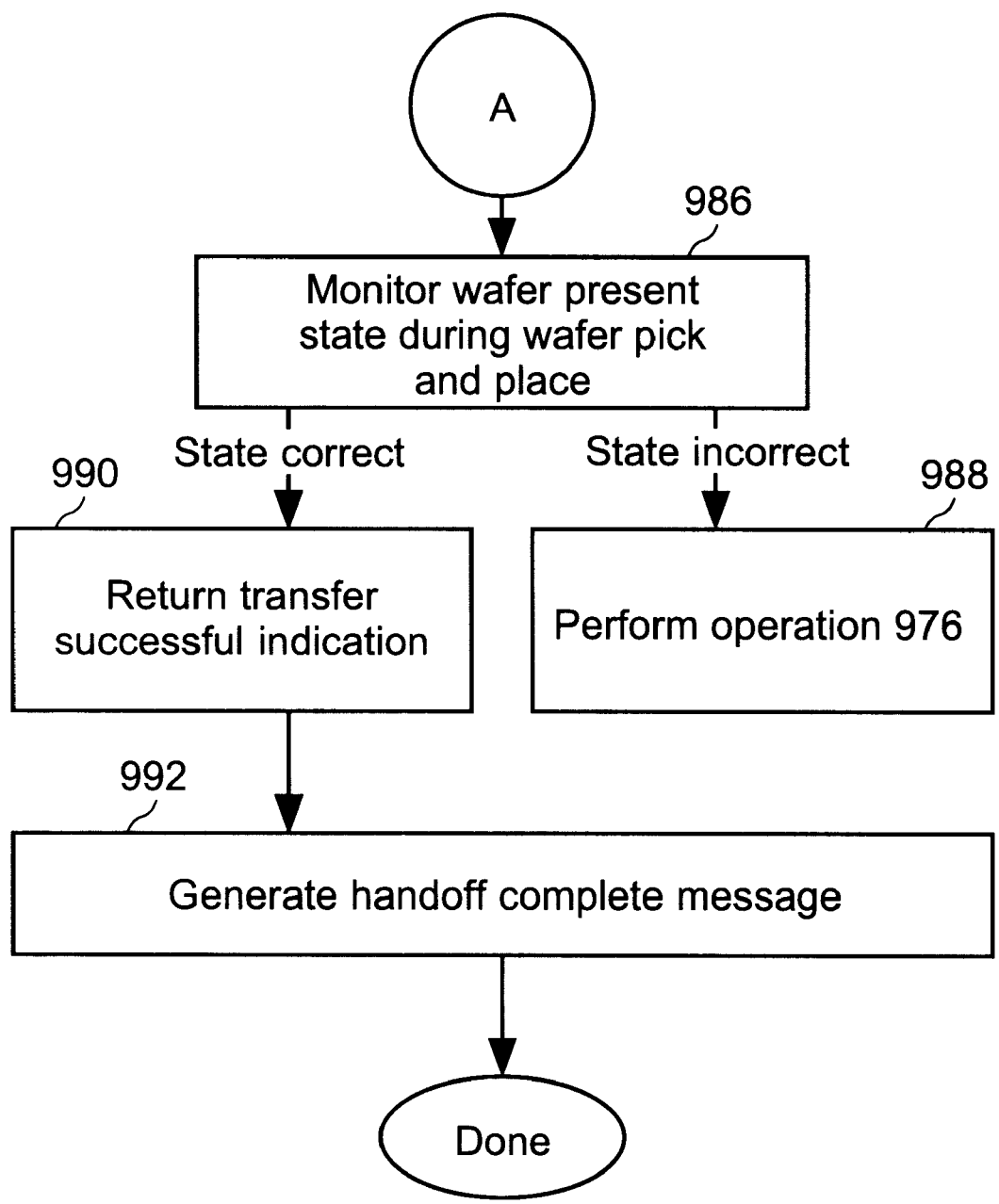

Reference is made to "A" at FIG. 16 where a continuation of the flowchart of FIG. 15 includes an operation 986. A "wafer present state," indicative of the presence of the wafer as the end effector 938 picks up the wafer, is sensed by the sensor 814 of the interlock 856 to perform the monitoring of operation 986. If the state is incorrect (i.e., if the wafer is not present), an operation 988 calls the operation 976 to generate the error message and halt the preparation sequence. If the state is correct (ie., the wafer is present), an operation 990 returns a "transfer successful" indication, and in an operation 992 a "handoff complete" message is generated.

Figure 17:
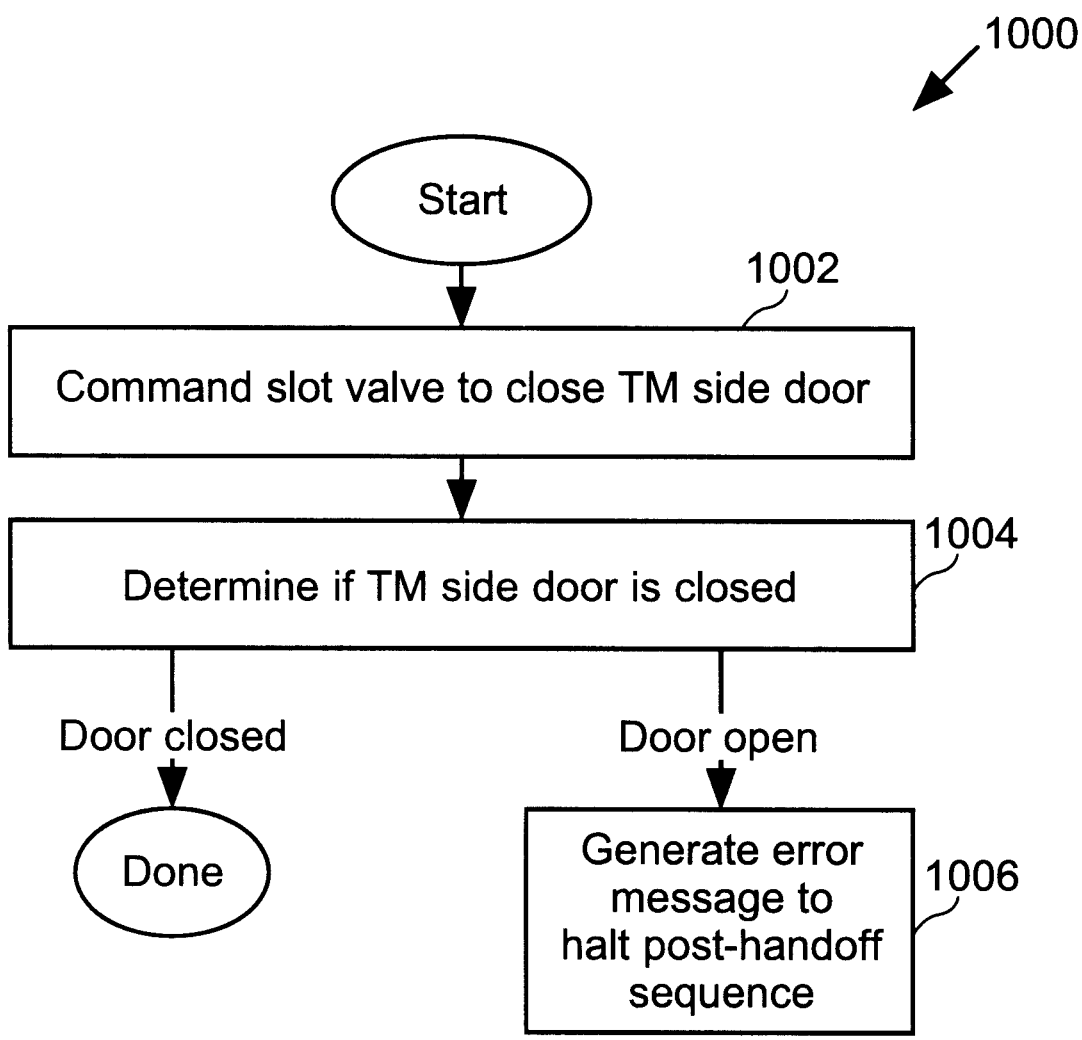
FIG. 17 depicts a flowchart illustrating certain of the FIG. 11 operations in the method of controlling preparation of the transport module and the selected process module for operation in the normal state, wherein the certain operations follow transfer of the wafer between the modules and relate to the transport module ("TM post-handoff" situation).

Preparation of the TM 202 for operation in the normal state continues according to a flowchart 1000 shown in FIG. 17. The flowchart 1000 depicts what is referred to as a "TM post-handoff" sequence, indicating a sequence performed for the TM 202 after the wafer transfer is completed. An operation 1002 commands the slot valve 204a to close the TM side door 222-2. In operation 1004, via the sensor 810 and the interlock 854, a determination is made as to whether the TM side door 222-2 is closed. If it is closed, the method of flowchart 1000 is done. If not, an error message is generated in operation 1006 to halt the TM post-handoff sequence.

Figure 18:
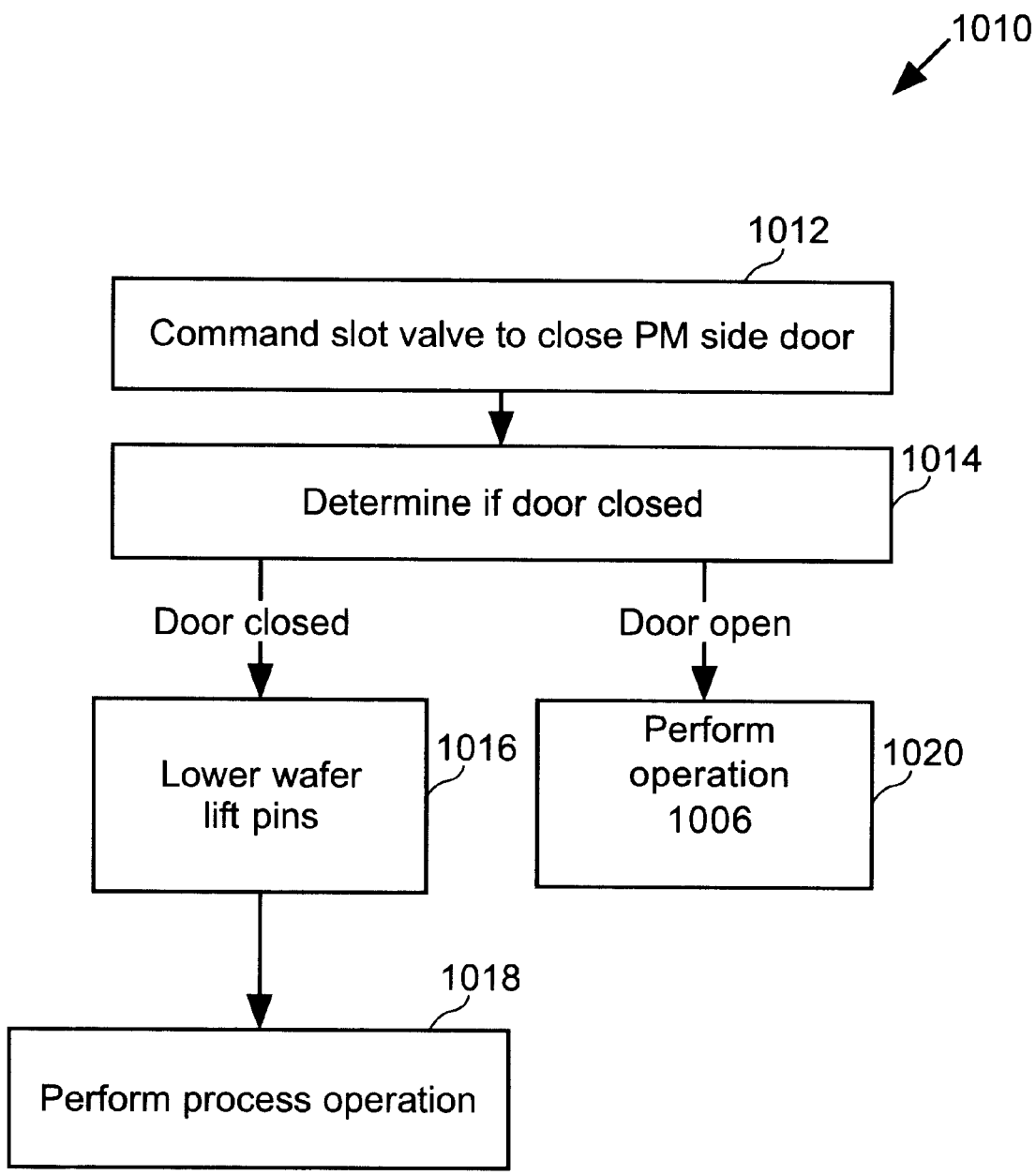
FIG. 18 depicts a flowchart similar to FIG. 17, wherein the certain operations follow transfer of the wafer between the modules and relate to the process module ("PM post-handoff" situation).

Asynchronously with the TM post-handoff sequence, preparation of the PM 206 for operation in the normal state continues according to a flowchart 1010 shown in FIG. 18. The flowchart 1010 depicts what is referred to as a "PM post-handoff" sequence. An operation 1012 commands the slot valve 204a to close the PM side door 222-1. In operation 1014, via the sensor 808 and the interlock 852, a determination is made as to whether the PM door is closed. If it is closed, operation 1016 lowers the wafer lift pins 962, and then an operation 1018 causes the PM 206 to perform the intended process operation. If the door is open, operation 1020 causes operation 1006 to be performed to generate the error message to halt the PM post-handoff sequence.

As noted above, in the maintenance state the PM 206 is under full power. While all of the PM 206 functions may be performed as intended within the scheme of the cluster tool architecture 802, the TM controller 402a does not attempt to transfer wafers to the module 206, and does not respond to certain signals from the module 206. The module 206 is controlled by the control system 800 to operate under local control via the PM controller 402b and a control device, such as a handheld display or a computer, 1300 to perform certain maintenance functions for problem diagnosis, cleaning, or testing, for example. Also, the control interface 804 may be controlled by a system user interface, such as another computer 1302.

Figure 10:
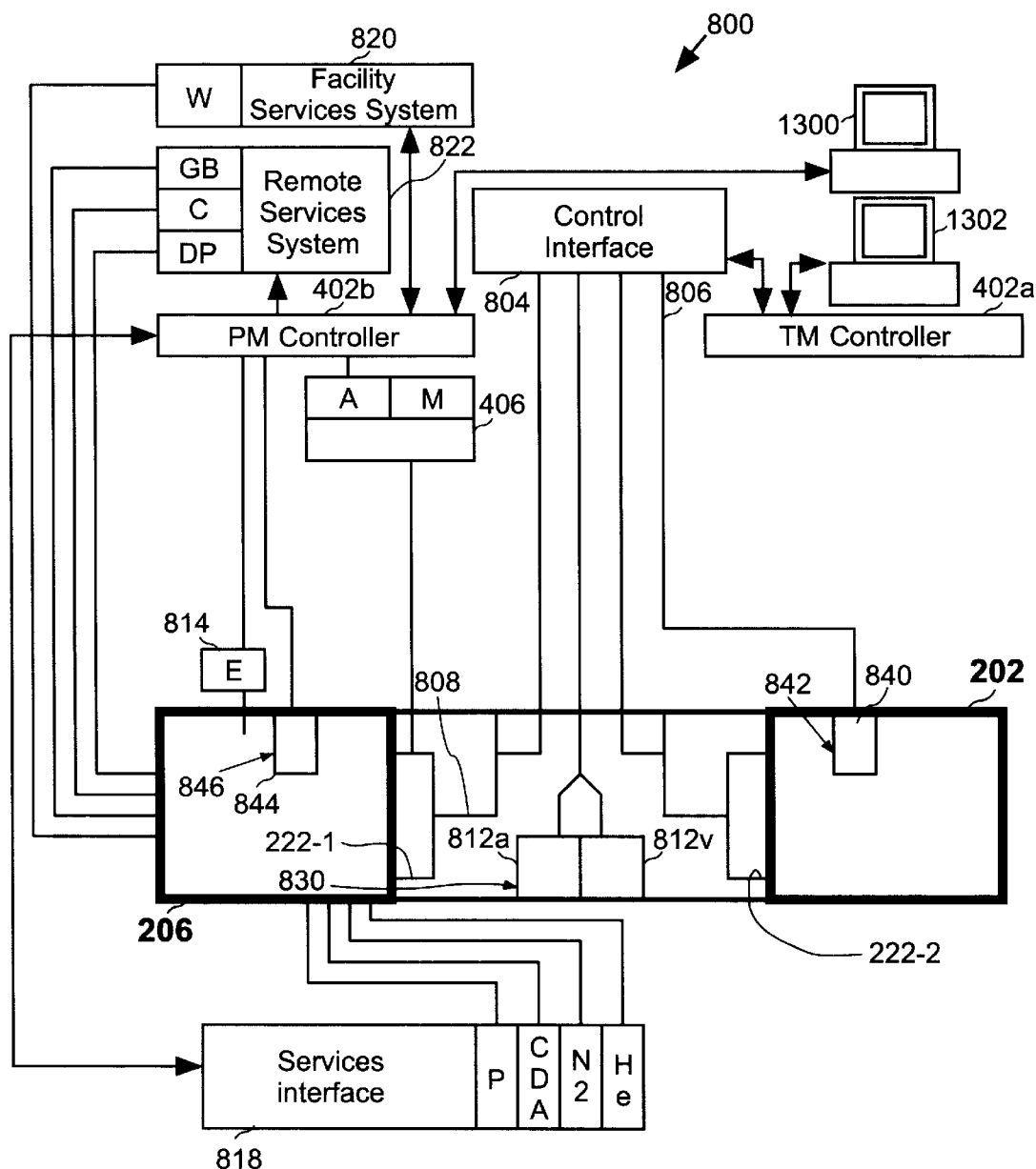
FIG. 10 is a schematic diagram of the system for controlling the operations of the transport module and the process modules in preparation for a maintenance state of the process module.
Figure 19:
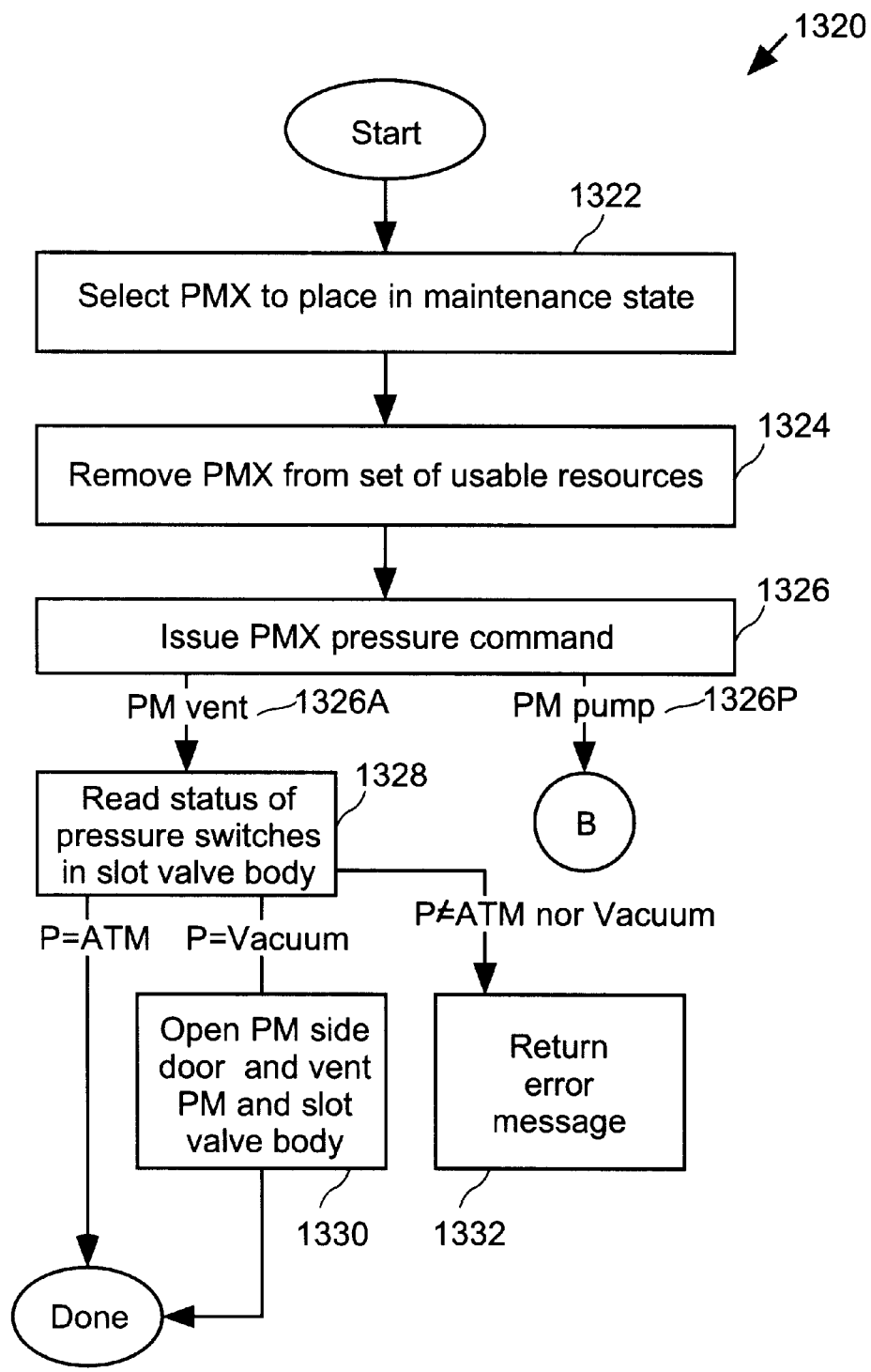
FIGS. 19 and 20 depict a flowchart illustrating operations in a method of controlling preparation of the transport module and a selected process module for the maintenance state of the selected process module.

Referring to FIG. 10 in conjunction with FIG. 19, a flowchart 1320 is depicted for initiating the maintenance state of the PM 206. The operator uses the computer 1302 to perform an operation 1322 to select one of the PMs 206 as the PMX to be placed in the maintenance state. Operation 1324 removes the selected PM 206 (PMX) from a set of useable resources that the TM keeps as a reference. The TM controller 402a sends a message to the PM controller 402b identifying the selected PMX. Via the computer 1300, operation 1326 then issues a PMX pressure command 1326. The PMX pressure command 1326 may be either to vent the PM 206 to atmosphere, in which case the command is a "PM Vent" command 1326V, or to pump the PM down to vacuum, in which case the command is a "PM Pump" command 1326P.

For the PM Vent command 1326V situation, the status of the pressure switch 812 in the valve body 212 is read in operation 1328, and a branch is taken according to the pressure that was read. If the pressure read is atmospheric (ATM), the initiation of the maintenance state of the PM 206 is done. If the pressure read is vacuum, then in an operation 1330 the PM side door 222-1 is opened to vent the PM 206 and the slot valve body 212 to establish atmospheric pressure in the body 212. If neither atmospheric pressure nor vacuum is sensed, in operation 1332 an error message is returned and the attempt to place the PMX in the maintenance state is halted.

Figure 20:
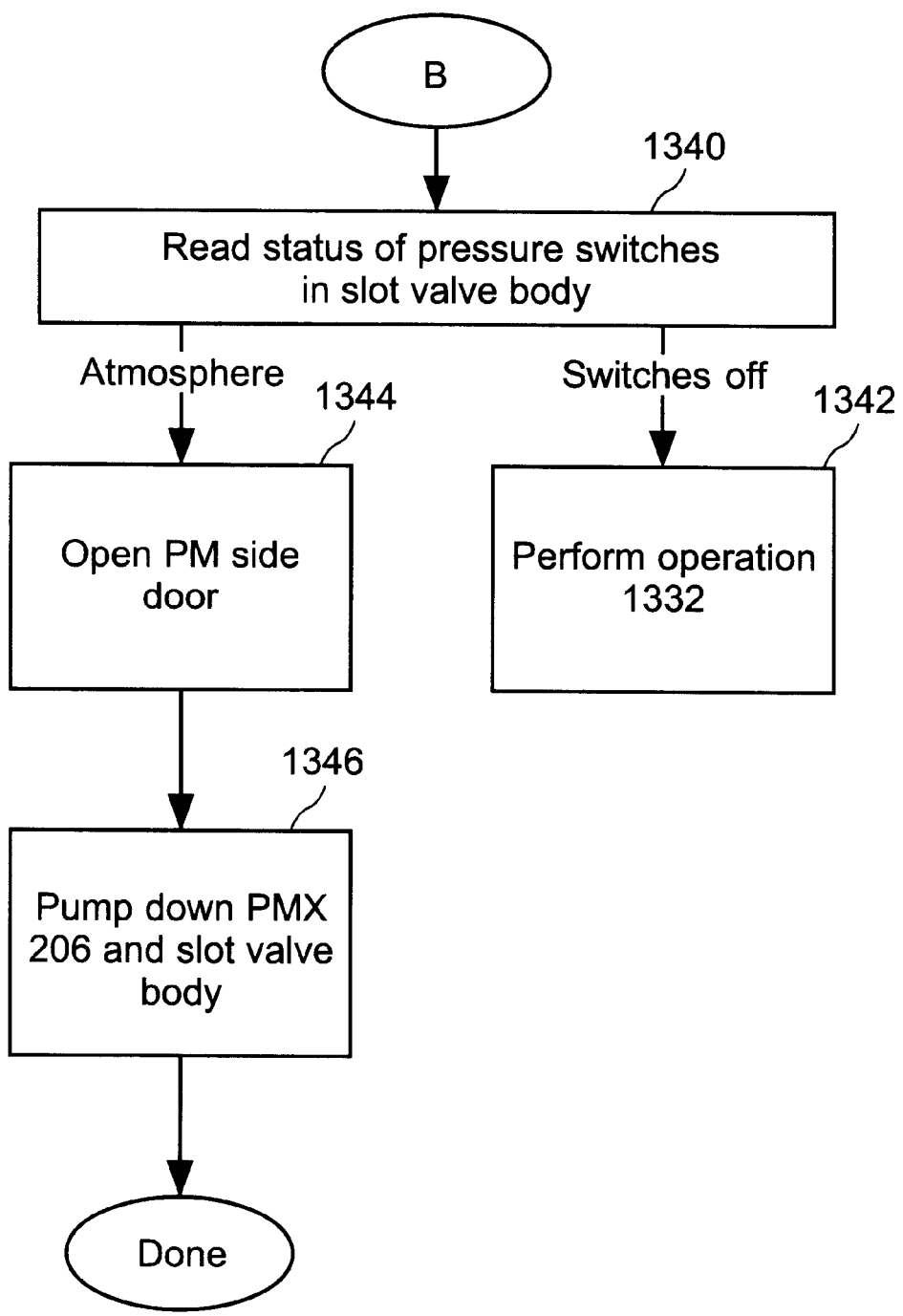

For the PM Pump command 1326P situation, reference is made at "B" in FIG. 19 to "B" in FIG. 20. The status of each of the pressure switches 812a and 812v in the valve body 212 is read in operation 1340, and a branch is taken according to the pressure that was read. If the read pressure is atmospheric, the initiation of the maintenance state of the PM 206 continues with operation 1344 to open the PM side door 222-1. Then, in operation 1346 both the PMX 206 and the slot valve body 212 are pumped down, and the initiation of the maintenance state of the PM 206 is done. If the pressure read is not sensed because the switches 812a and 812v are off, then in an operation 1342 operation 1332 is called and an error message is returned.

Figure 21:
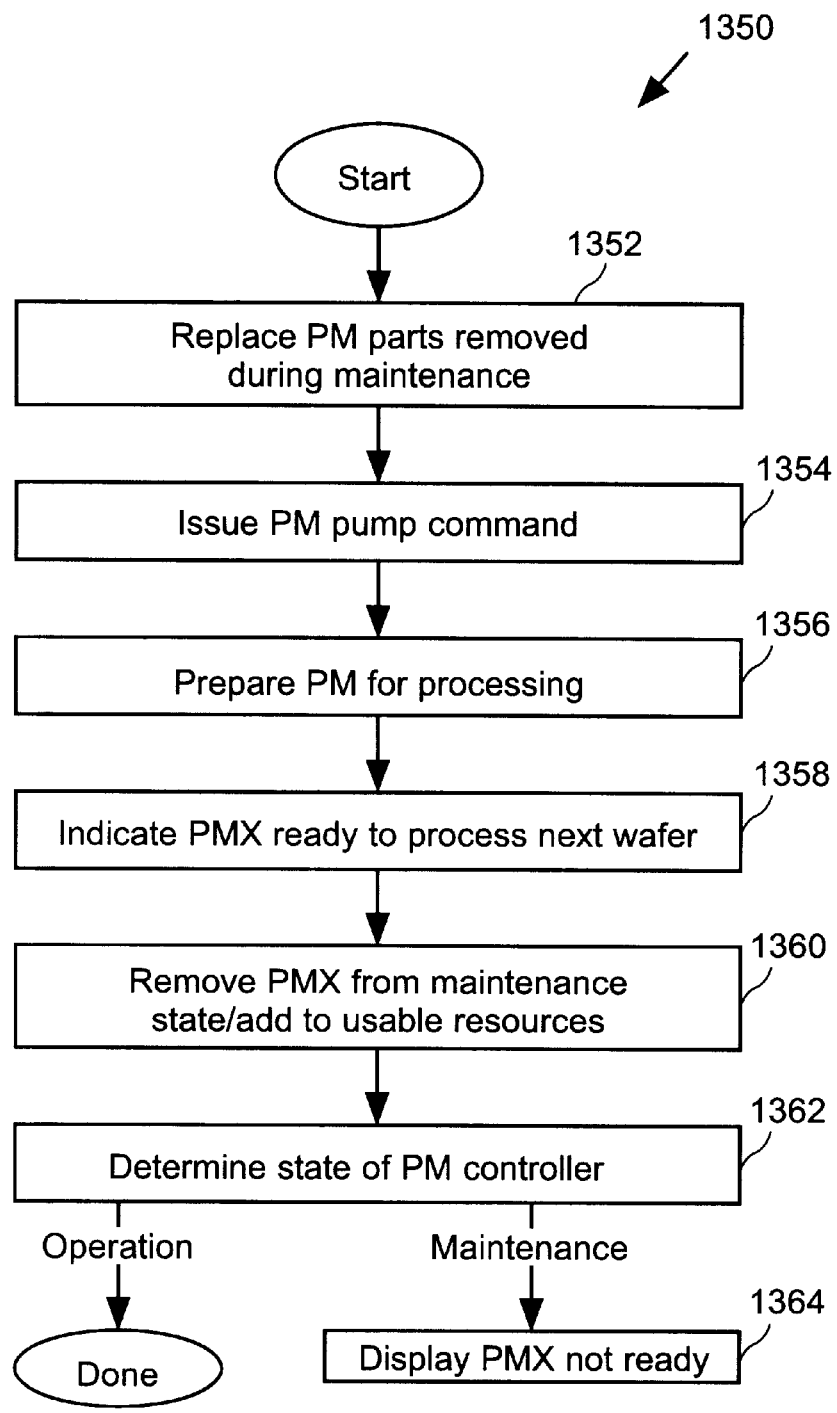
FIG. 21 depicts a flowchart illustrating operations in a method of controlling preparation of the selected process module for removal from the maintenance state.
Figure 22:
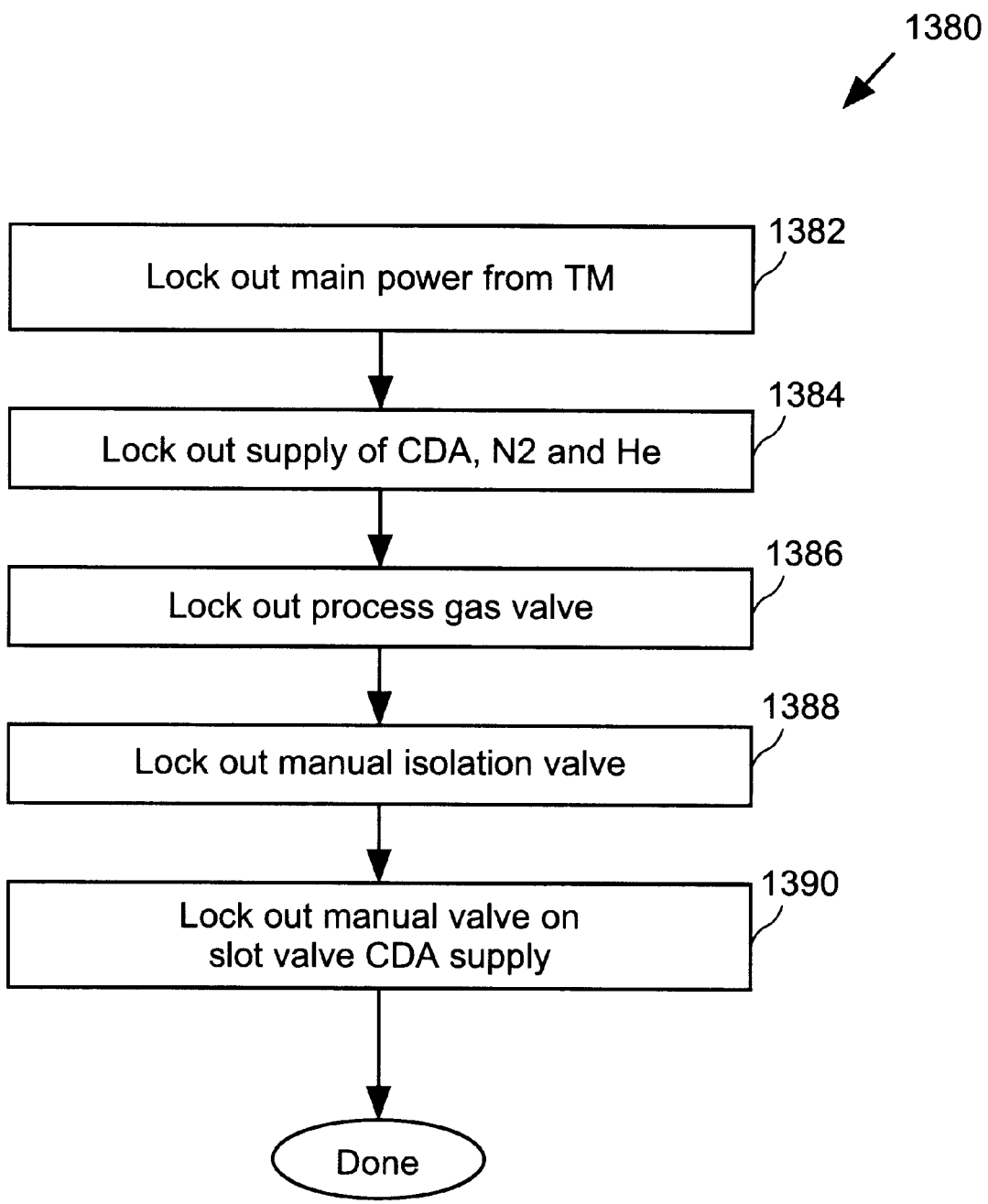
FIG. 22 depicts a flowchart illustrating operations for placing the process module in the locked out state.

After the operator completes the maintenance operations, the PMX may be returned to the normal state according to the operations shown in flowchart 1350 in FIG. 21. It may be recalled that after the PM Vent command 1326V is given, the body 212 may have been opened by removing the lid 236 or the door 222-1 may have been removed. Therefore, to return to the normal state, in operation 1352 the parts that were removed (e.g., the lid 236 and the door 222-1) are replaced. Then, a PM Pump command is issued in operation 1354 and the PMX 206 is pumped down to vacuum. Then, in operation 1356 the PMX 206 is prepared for processing.

An indication is then sent in operation 1358 that the PMX 206 is ready to process the next wafer. To complete the return to the normal state, operation 1360 causes the TM controller 402a to remove the PMX 206 from the maintenance state and add it to the list of useable resources. Upon determining (operation 1362) that the state of the PM controller 402b is "operation," the return of the PMX 206 to the normal state is done. If the state is determined to be "maintenance," then in operation 1364 a display can indicate "PMX NOT READY," for example.

As noted above, in the "locked out" state the module 206 is not powered, and cannot be operated under the control of the control system 800, yet the dual sided slot valve 204a may be operated under manual control via switch 406. The locked out state permits the PMX 206 to be serviced safely as described above with respect to FIG. 5A. In detail, the preparation for the locked out state of the PMX 206 is initially according to the operations of the flowchart 1320 (FIG. 19) which end in the slot valve 204a being at atmospheric pressure as determined in operation 1328.

The process can then move to flowchart 1380 which includes a series of lock out operations 1382, 1384, 1386, 1388, and 1390 in which respective main power is locked out, the supply of certain gases is locked out, the process gas valve is locked out, and the manual valve on the slot valve CDA supply is locked out.

In review, it is seen that the control system 800 of the present invention fills the above-described needs by providing the dual sided slot valve 204a in a vacuum body 212 between the adjacent PM 206 and TM 202 of the cluster tool architecture system 802, and the control system 800 controls the operation of the dual sided slot valve 204a to facilitate various states of operation of the PM 206. The separate valves 204a are provided for each of two valve housing ports 218, such that the housing port 218 and a mating port of the PM 206 or TM 202, for example, may be separately closed or opened independently of the other cooperating housing port 218 and PM port. The separate valves 204a facilitate maintaining a vacuum, for example, in the TM 202 while an adjacent PM 206 is opened to the atmosphere to allow servicing to be performed. As a result, substantial periods of downtime are avoided in that no pump down cycle is needed to bring the TM 202 to a desired vacuum after servicing the selected PMX 206, and no other operations need be performed on the TM 202 due to the servicing of the PMX 206.

Also, with the TM 202 at vacuum, and with the port to the PMX 206 closed by a valve door 222-2 next to the TM 202, corrosive gases and plasma in the PMX 206 do not contaminate the TM 202 and the valve door 222-2 next to the TM 202 is not subject to etching in response to materials in the PMX 206. Thus, in general, only the valve door 222-1 next to the PM 206 need be replaced during servicing after it becomes corroded, and the TM 202 may remain at vacuum during such replacement. Finally, the other valve door 222-2 between the valve 204a and the PMX 206 reduces the corrosion of other parts of the valve 204a.

Further, the dual sided slot valve 204a is provided with these advantages while initially allowing easy access to an open valve 204a for performing service on the valve 204a. It may be understood, then, that while normal operations continue in one PM 206 of two adjacent modules, the control system 800 operates to allow many types of servicing to be performed in the other of the two PMs 206, i.e., the PMX 206. Such servicing may, for example, involve the maintenance state, or the locked out state, of the PM 206. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A control system for use in a semiconductor process cluster architecture arrangement in which a transport module mechanically interfaces with at least one process module, the transport module being adapted to transport a semiconductor wafer to the process module, the process module being adapted to perform at least one semiconductor processing operation, wherein the mechanical interface is provided by a valve, the control system comprising:

a first controller for the at least one process module;

a second controller for the transport module, the second controller being programmed to sequence a flow of the semiconductor wafer to the at least one process module; and a control interface between the first and second controllers for controlling the operations of the at least one process module and the transport module.

2. A control system as recited in claim 1, wherein the valve is a dual slot valve provided with a housing having a first side and a second side, the housing having a first slot at the first side and a second slot at the second side for passing a substrate between the at least one process module and the transport module, the at least one process module being attached to the first side of the housing and the transport module being attached to the second side of the housing;

a first door being movably mounted within the housing to enable closure of the first slot;

a second door being movably mounted within the housing to enable closure of the second slot;

the first controller operating the first door; and
the second controller operating the second door.

3. A control system as recited in claim 1, wherein:
the second controller is programmed to respond to a signal from the at least one process module that it is ready to perform a next processing operation to cause the modules to perform a series of operations so as to enable the at least one process module to perform at least one semiconductor processing operation, the series of operations comprising:
conditioning the at least one process module and the transport module for transferring a semiconductor wafer between the modules;
performing the transfer of the semiconductor wafer; and
performing a post-wafer transfer sequence of operations.

4. A control system as recited in claim 3, wherein the conditioning operation further comprises:
commanding the at least one process module and the transport module to each attain a wafer transfer pressure.

5. A control system as recited in claim 1, wherein:
the valve comprises a dual slot valve having a body, opposite sides, a port in each of the opposite sides, each of the sides being adjacent to a respective one of the modules, the valve further having switches for sensing the pressure in the valve body, a first door for closing a first port in one of the sides, and a second door for closing a second port in the other of the sides;
the control system further comprising:
a system user interface connected to the transport module controller for inputting a signal to enter a maintenance state; and
a local user interface connected to the at least one process module controller for issuing commands to the at least one process module to perform maintenance-ready operations, the commands including:
to determine the status of the switches of the dual slot valve body; and
in response to one of the switches that senses a vacuum in the body, to cause the door on the side of the at least one process module to open.

6. A control system as recited in claim 5, wherein:
the local user interface further issues commands to the process module to perform locked-out maintenance-ready operations, the commands including:
a lock out command to instruct locking out of power from the transport module, and of the supply of selected gases to the process module, and of the supply of process gases.

7. A control system as recited in claim 1, further comprising:
the architecture arrangement further comprising facility services and remote services for the process module; and
wherein the first controller controls the supply of the services from the remote services and the facility services independently from the second controller.

8. A control system as recited in claim 1, the control system further comprising;
facilities for supplying power, CDA, and gases to the process module; and
a services interface between the transport module and the at least one process module for controlling the facilities to supply the power, CDA, and gases to the at least one process module.

9. A method of operating a cluster tool architecture for use in semiconductor processing, the architecture comprising a transport module mechanically interfacing with at least one process module, the transport module being adapted to transport a semiconductor wafer to the at least one process module, the at least one process module being adapted to perform at least one semiconductor processing operation, wherein the mechanical interfacing is provided by a valve having a first door adjacent to the at least one process module and a second door adjacent to the transport module, the method comprising the operations of:
verifying that the valve is at vacuum and opening the first door;
indicating that the at least one process module is ready to perform a next processing operation;
conditioning the at least one process module and the transport module for transferring a semiconductor wafer between the modules, the conditioning including the operation of verifying that the pressure in the transport module is vacuum, and opening the second door;
transferring the semiconductor wafer between the modules; and
performing a post-wafer transfer sequence of operations, the sequence of operations comprising closing the first and second doors.

10. A method of operating a cluster tool architecture as recited in claim 9, wherein the transferring operation further comprises:
monitoring the presence of the wafer during the transfer of the wafer between the modules.

11. A method of operating a cluster tool architecture as recited in claim 9, wherein the architecture comprises a robot for picking up a wafer in the transport module and placing the wafer into the at least one process module, the method further comprising the operations of:
transferring the semiconductor wafer between the modules, the transferring including:
commanding the robot to transfer the wafer from the transport module to the at least one process module,
monitoring a wafer present state during the wafer picking and placing, and
returning a transfer successful indication.

12. A method of operating a cluster tool architecture as recited in claim 9, wherein the operation of verifying that the pressure in the transport module is at vacuum further comprises:
determining that the pressure in the transport module is not at vacuum, closing the second door of the valve adjacent to the transport module, and commanding the transport module to pump down to vacuum.

13. A method of operating a cluster tool architecture as recited in claim 9, further comprising the operations of:
determining that the pressure in the at least one process module is not at vacuum, and closing the first door, and adjusting the pressure to a wafer transfer pressure.

14. A method of operating a cluster tool architecture as recited in claim 12, wherein the architecture comprises a robot for transferring the wafer, the robot having an end effector for holding the wafer, further comprising:
adjusting the process module pressure to a wafer exchange pressure;
opening the first door;

indicating that the process module is ready for transfer;

generating a command to the robot to move the end effector to the process module; and commanding the robot to exchange the wafer.

15. A method of operating a cluster tool architecture as recited in claim 9, wherein the performing of the post-wafer transfer sequence of operations further comprises:

determining that each of the first and second doors is closed.

16. A method of placing a first portion of a cluster tool architecture in a maintenance state while allowing second portions of the architecture to operate normally for semiconductor processing, the second portions of the architecture comprising a transport module mechanically interfacing with a plurality of process modules, the first portion of the architecture comprising another process module that requires maintenance during the normal operations of one or more elements of the second portions of the architecture, the transport module also mechanically interfacing with the process module that is the first portion of the architecture, each of the process modules being adapted to perform at least one semiconductor processing operation and to perform under power operations for problem diagnosis and cleaning and testing, wherein the mechanical interfacing is provided by a dual slot valve having a valve body, a first door in the valve body adjacent to the processing module that is the first portion and a second door in the valve body adjacent to the transport module, the method comprising the operations of:

maintaining the second door closed during the following operations so as to continue the normal operations;

selecting the first portion as the process module to be placed in the maintenance state;

removing the selected first portion from a set of modules useable with the transport module for the normal operations during the maintenance state of the selected first portion;

issuing a pressure command for the selected first portion;

determining whether the pressure in the valve body is atmospheric or vacuum; and if the pressure in the valve body is vacuum, opening the first door and venting the selected first portion and the valve body.

17. A method as recited in claim 16, wherein the selected first portion is returned to an operational state from the maintenance state upon completing the maintenance of the selected first portion; further comprising the operations of:

issuing a pump command to place the selected first portion under vacuum;

preparing the selected first portion for processing; and placing a process module controller in a state of readiness for normal operations.

18. A method as recited in claim 17, further comprising:

adding the selected module to the set of modules useable with the transport module for the normal operations; and determining that the controller is in a state for normal operations.

19. An interlocked control system for use in a semiconductor process cluster architecture arrangement in which a transport module mechanically interfaces with at least one process module, the transport module being adapted to transfer a semiconductor wafer to the at least one process module, the at least one process module being adapted to perform at least one semiconductor processing operation upon completion of a wafer transfer operation, the interlocked control system comprising:

the mechanical interface being provided by a dual slot valve having a housing having a first side and a second side, the housing having a first slot at the first side and a second slot at the second side for passing a wafer between the at least one process module and the transport module, the at least one process module being attached to the first side of the housing and the transport module being attached to the second side of the housing; a first door being movably mounted within the housing to close the first slot; a second door being movably mounted within the housing to close the second slot;

a first controller for the at least one process module, the first door being controlled by the first controller to facilitate a sequence of the wafer transfer operation for transferring a wafer between the at least one process module and the transport module;

a second controller for the transport module, the second door being controlled by the second controller to facilitate the sequence of the wafer transfer operation for transferring a wafer between the at least one process module and the transport module, the second controller being further programmed to sequence the wafer between the transport module and the at least one process module;

a first sensor for detecting whether the first door is open or closed and generating a first control signal indicating that the first door is open;

a second sensor for detecting whether the second door is open or closed and generating a second control signal indicating that the second door is open; and a control interface between the first and second controllers for coordinating flow of the first and second control signals between the at least one process module and the transport module so that in response to either or both of the first and second control signals the sequence of the wafer transfer operation is interrupted.

20. A system as recited in claim 19, further comprising:

a sensor for determining that the pressure in either the at least one process module or the transport module is not at a respective vacuum or a transfer state and generating respective error messages; and wherein the control interface coordinates flow of the error messages to cause the respective first and second controllers to stop the sequence of the wafer transfer operation.

21. A system as recited in claim 19, further comprising:

a sensor for determining that a wafer is not present in one of the modules during the sequence of the wafer transfer operation and generating an error message; and wherein the control interface coordinates flow of the error message to cause the respective first and second controllers to stop the sequence of the wafer transfer operation.

* * * * *